(12) United States Patent
Fujii et al.

(10) Patent No.: US 7,698,671 B2
(45) Date of Patent: Apr. 13, 2010

(54) METHOD FOR DESIGNING SEMICONDUCTOR INTEGRATED CIRCUITS HAVING AIR GAPS.

(75) Inventors: Tsutomu Fujii, Osaka (JP); Hirofumi Miyashita, Osaka (JP); Hiromasa Fukazawa, Kyoto (JP); Tatsuo Gou, Kyoto (JP); Takuya Yasui, Kyoto (JP)

(73) Assignee: Panasonic Corporation, Osaka (JP)

( * ) Notice: Subject to any disclaimer, the term of this patent is extended or adjusted under 35 U.S.C. 154(b) by 223 days.

(21) Appl. No.: 11/942,384

(22) Filed: Nov. 19, 2007

(65) Prior Publication Data

US 2008/0120583 A1 May 22, 2008

(30) Foreign Application Priority Data

Nov. 22, 2006 (JP) ............................ 2006-315745

(51) Int. Cl.
*G06F 17/50* (2006.01)
*G06F 9/45* (2006.01)

(52) U.S. Cl. .................... 716/5; 716/1; 716/12; 716/18

(58) Field of Classification Search ...................... 716/1, 716/5, 18
See application file for complete search history.

(56) References Cited

U.S. PATENT DOCUMENTS

| 5,310,700 | A | 5/1994 | Lien et al. |
| 6,093,633 | A | 7/2000 | Matsumoto |
| 2004/0097065 | A1 | 5/2004 | Lur et al. |

FOREIGN PATENT DOCUMENTS

| JP | 63-098134 | 4/1988 |
| JP | 7-114236 | 12/1995 |
| JP | 7-326670 | 12/1995 |
| JP | 2003-078015 | 3/2003 |
| JP | 3481222 | 10/2003 |

*Primary Examiner*—Jack Chiang
*Assistant Examiner*—Magid Y Dimyan
(74) *Attorney, Agent, or Firm*—McDermott Will & Emery LLP

(57) ABSTRACT

Circuit data on a semiconductor integrated circuit, design constraints as to design of the semiconductor integrated circuit, air gap information on air gap creation in the circuit data, and an air gap volume constraint specifying an allowable range for an air gap volume value are received. The sum total of the values of the volumes of air gaps created in the circuit data according to the air gap information is calculated. Upon detection that the calculated sum total of the air gap volume values falls outside the allowable range specified by the air gap volume constraint, the circuit data is optimized so that the design constraints are satisfied and the sum total of the air gap volume values falls within the allowable range.

12 Claims, 23 Drawing Sheets

FIG. 2

Air gap volume constraint

| Sum total of cell areas | 0~5 | 5~10 | 10~15 | 15~20 |
|---|---|---|---|---|
| Allowable range of air gap volume value | 0.0~0.5 | 0.5~1.0 | 1.0~1.5 | 1.5~2.0 |

FIG. 3A

Cell information (cell area, air gap volume value)

| Logic cell | Cell area | Air gap volume value |
|---|---|---|
| BUFX4 | 3 | 0.5 |
| BUFX2 | 2 | 0.2 |
| FF1 | 2 | 0.2 |
| FF2 | 2 | 0.2 |
| INV2 | 2 | 0.2 |

FIG. 3B

Cell information

```
(Example format)
Cell name   Air gap volume value
(Example descriptions)
BUFFERX1   10   ※Indicating that air gap creation volume value in BUFFERX1 is 10
BUFFERX2   20   ※Indicating that air gap creation volume value in BUFFERX2 is 20
BUFFERX4   100  ※Indicating that air gap creation volume value in BUFFERX4 is 100
    :
    :
```

FIG. 6A

Air gap creation condition

| Facing length \ Facing interval | 0 | 1 | ... | S1 | ... | X |
|---|---|---|---|---|---|---|
| 0 | Non | Non | ... | Non | ... | Non |
| 1 | Non | Creation | ... | Creation | ... | Non |
| ... | ... | ... | ... | ... | ... | ... |
| L1 | Non | Creation | ... | Creation | ... | Non |
| L2 | Non | Creation | ... | Creation | ... | Non |
| L3 | Non | Creation | ... | Creation | ... | Non |
| ... | ... | ... | ... | ... | ... | ... |
| Y | Non | Creation | ... | Creation | ... | Non |

FIG. 6B

Air gap creation condition

Facing length = 0, 1, .... M
Facing interval = 0, 1, .... N
Air gap creation? = { 0, 0, ... 0
                        0, 1, ... 0
                        : :   :
                        0, 1, ... 0 }

※ 1 represents a case where an air gap is created, and 0 represents a case where no air gap is created

FIG. 7A

Air gap calculation method

| Facing length \ Facing interval | 0 | S1 | ... | Sn |
|---|---|---|---|---|
| 0 | 0 | 0 | ... | 0 |
| L1 | 0 | 0.1 | ... | 2 |
| L2 | 0 | 0.2 | ... | 3 |
| L3 | 0 | 0.4 | ... | 5 |
| ... | ... | ... | ... | ... |
| Lm | 0 | 5 | ... | 10 |

FIG. 7B

Air gap calculation method

```
Facing length      = 0, L1, L2, L3, ···M
Facing interval    = 0, S, ···N
Air gap volume value = { 0,  0,  ··· 0
                         0,  0.1, ··· 2
                         0,  0.2, ··· 3
                         0,  0.4, ··· 5
                         :   :    :
                         0,  5,   ···10 }
```

FIG. 8A

Air gap volume constraint

| Area size | 5 | 10 | 15 | 20 |
|---|---|---|---|---|
| Allowable range of air gap volume value | 0.0~0.5 | 0.5~1.0 | 1.0~1.5 | 1.5~2.0 |

FIG. 8B

Air gap volume constraint

```
(Example format)
Size of check area in which air gap volume value is checked     Value of area size
                              ( When no check area is defined, the entire
                                 chip area is considered to be a check area )
Layer      Upper    Lower
name       limit    limit
(Example descriptions)
Size of check area in which air gap volume value is checked    10
                                                        ※Area size is defined to be 10
M1_AirGap    1    10  ※ In 1st wiring layer, air gap lower limit is defined to be 1 and
                         upper limit is defined to be 10
M2_AirGap    1    10  ※ In 2nd wiring layer, air gap lower limit is defined to be 1 and
     :                   upper limit is defined to be 10
```

FIG. 13A

Air gap creation condition

| Facing interval | 0 | 1 | 2 | ... | X |
|---|---|---|---|---|---|
| AirGap | Non | Creation | Creation | ... | Non |

FIG. 13B

Air gap creation condition

Facing interval = 0, 1, 2, .... N
Air gap creation? = { 0, 1, 1, ... 0}

※1 represents a case where an air gap is created, and 0 represents a case where no air gap is created Air gap creation place information

|  | Central coordinates | | Area size | | Layer | Volume |
|---|---|---|---|---|---|---|
|  | X | Y | Vertical dimension | Horizontal dimension | | |
| P401 | 2 | 5 | 2 | 5 | Metal1 | 7.5 |
| P402 | 4 | 8 | 4 | 8 | Metal2 | 4.5 |
| P403 | 8 | 4 | 8 | 4 | Metal3 | 3.5 |

FIG. 16

Air gap creation prohibition constraint

```
(Example format)
Layer name           Layer number (Example descriptions)
M1_AirGap_Forbidden    LayerNumber1
        ※Layer definition for air gap creation prohibition in 1st wiring layer
M2_AirGap_Forbidden    LayerNumber2
        ※Layer definition for air gap creation prohibition in 2nd wiring layer
      :
      :
MX_AirGap_Forbidden    LayerNumberX
        ※Layer definition for air gap creation prohibition in X-th wiring layer
ALL_AirGap_Forbidden   LayerNumberY
        ※Layer definition for air gap creation prohibition in all wiring layers
```

FIG. 17

Air gap non-creation instruction

```
(Example format)
Layer name           Layer number (Example descriptions)
M1_AirGap_NoGenerate   LayerNumber1
        ※Layer definition for control for prevention of air gap creation
          in fabrication process in 1st wiring layer
M2_AirGap_NoGenerate   LayerNumber2
        ※Layer definition for control for prevention of air gap creation
          in fabrication process in 2nd wiring layer
      :
      :
MX_AirGap_NoGenerate   LayerNumberX
        ※Layer definition for control for prevention of air gap creation
          in fabrication process in X-th wiring layer
ALL_AirGap_NoGenerate  LayerNumberY
        ※Layer definition for control for prevention of air gap creation
          in fabrication process in all wiring layers
```

FIG. 18

Air gap creation instruction

```
(Example format)
Layer name            Layer number (Example descriptions)
M1_AirGap_Generation    LayerNumber1
            ※Layer definition for air gap creation instruction in 1st wiring layer
M2_AirGap_Generation    LayerNumber2
            ※Layer definition for air gap creation instruction in 2nd wiring layer
  :
  :
MX_AirGap_Generation    LayerNumberX
            ※Layer definition for air gap creation instruction in X-th wiring layer
ALL_AirGap_Generation   LayerNumberY
            ※Layer definition for air gap creation instruction in all wiring layers
```

FIG. 19

Air gap representation information

```
(Example format)
Layer name    Layer number (Example descriptions)
M1_AirGap    LayerNumber1
        ※Layer definition representing air gap creation places in 1st wiring layer
M2_AirGap    LayerNumber2
        ※Layer definition representing air gap creation places in 2nd wiring layer
  :
  :
MX_AirGap    LayerNumberX
        ※Layer definition representing air gap creation places in X-th wiring layer
```

FIG. 23A

Cell air gap creation prohibition constraint

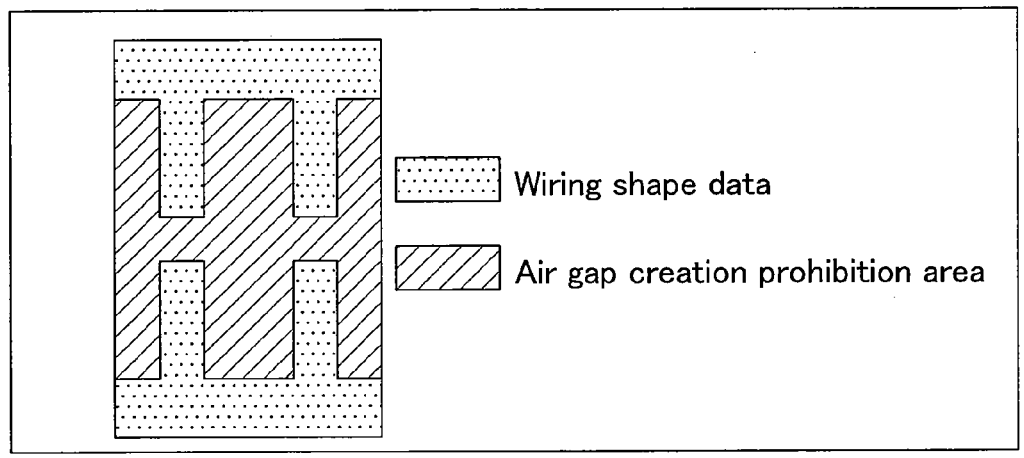

FIG. 23B

Cell air gap creation prohibition constraint (Example format)
Cell name    Air gap creation prohibition Yes/No ( Example descriptions)
BUFFERX1   NO    ※Air gap creation in a place where BUFFERX1 is placed is permitted
BUFFERX2   NO    ※Air gap creation in a place where BUFFERX2 is placed is permitted
BUFFERX4   YES   ※Air gap creation in a place where BUFFERX4 is placed is prohibited
      :
      :

FIG. 24A

Cell air gap non-creation instruction

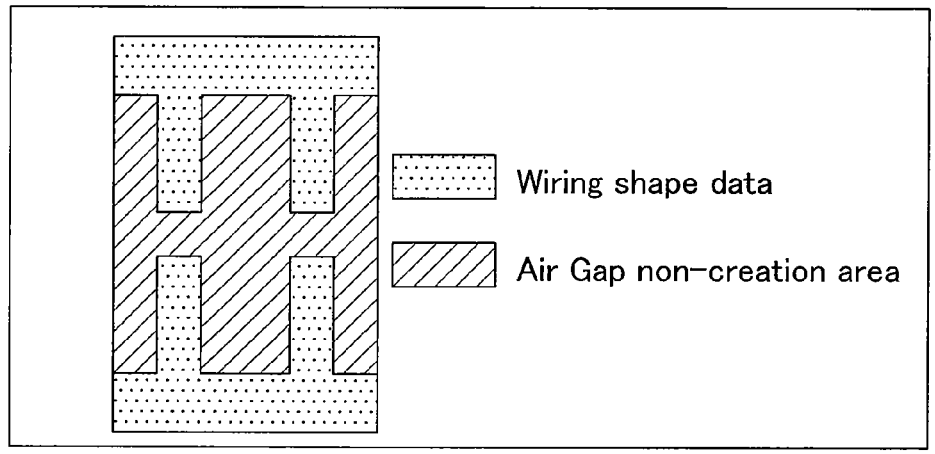

FIG. 24B

Cell air gap non-creation instruction (Example format)
Cell name    Is control performed to prevent air gap creation in fabrication process?
(Yes/No)

(Example descriptions)
BUFFERX1    NO
　※Control for prevention of air gap creation in fabrication process
　　in a place where BUFFERX1 is placed is not performed
BUFFERX2    NO
　※Control for prevention of air gap creation in fabrication process
　　in a place where BUFFERX2 is placed is not performed
BUFFERX4    YES
　※Control for prevention of air gap creation in fabrication process
　　in a place where BUFFERX4 is placed is performed
　⋮

METHOD FOR DESIGNING SEMICONDUCTOR INTEGRATED CIRCUITS HAVING AIR GAPS.

CROSS-REFERENCE TO RELATED APPLICATION

The disclosure of Japanese Patent Application No. 2006-315745 filed on Nov. 22, 2006 including specification, drawings and claims is incorporated herein by reference in its entirety.

BACKGROUND OF THE INVENTION

The present invention relates to techniques for semiconductor integrated circuit design process, and more particularly relates to design of a semiconductor integrated circuit having air gaps formed therein, support of the design of the semiconductor integrated circuit, and calculation of wiring parasitic capacitance in the design process of the semiconductor integrated circuit.

As miniaturization of semiconductor fabrication processes has been advanced, the spacing between signal wires in a semiconductor integrated circuit has been narrowed to increase the resulting wiring parasitic capacitance between the signal wires. As a result, the adverse effects of wiring delay and cross talk noise, which cause the design period to be extended and the performance to be degraded, can no longer be ignored.

In order to reduce the wiring parasitic capacitance between signal wires, there has been an air gap producing technique, in which air gaps are formed between the signal wires. In the "air gap" structure, air gaps are formed in an insulating film between wires. This structure allows the insulating film to have a lower dielectric constant than conventional ones, thereby enabling the wiring parasitic capacitance between the signal wires to be reduced.

Such air gap producing methods were disclosed in Japanese Examined Patent Application Publication No. 7-114236 (Patent Document 1) and in Japanese Laid-Open Publication No. 7-326670 (Patent Document 2). In the methods disclosed in these patent documents, a CVD process or a sputtering process are used to form air gaps in part of an insulating film between wires in a semiconductor integrated circuit. The part where the air gaps are formed and the volume of the air gaps are limited by the space between the wires. Specifically, if the space between wires is large, no air gaps can be formed therebetween. Also, Japanese Patent No. 348122 (Patent Document 3) proposed a technique for creating air gaps by controlling the spacing between wires.

To reduce the wiring parasitic capacitance between wires in a semiconductor integrated circuit, it is desired that many air gaps be created. However, if too many air gaps are present in a semiconductor integrated circuit, resistance to thermal and mechanical stresses may decrease, and if the locations and volumes of created air gaps are uneven in the chip, irregularities may occur in the chip.

In designing a miniaturized large-scale semiconductor integrated circuit, the designing must be performed in such a manner that various kinds of constraints not only as to air gaps but also as to delay, area, fabrication rules, etc. are satisfied. These constraints must be taken into account throughout the entire design process of the semiconductor integrated circuit. The constraints on air gaps thus also have to be considered throughout the entire design process of the semiconductor integrated circuit.

Nevertheless, the disclosed methods only show how to create air gaps in the fabrication process of a semiconductor integrated circuit, and no designing methods have been disclosed in which air gap formation is taken into account in the design process (such as a logic synthesis process and a layout process) of a semiconductor integrated circuit.

SUMMARY OF THE INVENTION

It is therefore an object of the present invention to control formation of air gaps in the design process of a semiconductor integrated circuit. To be specific, an object of the invention is to design a semiconductor integrated circuit in such a manner that air gaps are appropriately formed therein, or to support the designing of the semiconductor integrated circuit. Another object of the invention is to accurately calculate wiring parasitic capacitances in the design process of the semiconductor integrated circuit.

In an aspect of the present invention, a method for designing a semiconductor integrated circuit having air gaps formed therein includes: the input step of receiving circuit data on the semiconductor integrated circuit, design constraints as to design of the semiconductor integrated circuit, air gap information on air gap creation in the circuit data, and an air gap volume constraint specifying an allowable range for an air gap volume value; the calculation step of calculating the sum total of the values of the volumes of air gaps created in the circuit data according to the air gap information; the detection step of detecting that the sum total of the air gap volume values calculated in the calculation step falls outside the allowable range specified by the air gap volume constraint; and the optimization step of, upon detection in the detection step that the sum total of the air gap volume values falls outside the allowable range, optimizing the circuit data so that the design constraints are satisfied and the sum total of the air gap volume values falls within the allowable range.

In the inventive semiconductor integrated circuit design method, it is possible to control air gap volume values in the design process of the semiconductor integrated circuit, thereby enabling the design of the semiconductor integrated circuit having the air gaps appropriately formed therein.

In another aspect of the present invention, a method for supporting design of a semiconductor integrated circuit having air gaps formed therein includes: the input step of receiving circuit data, in which logic cells are placed and connected with each other by wires, air gap creation place information indicating air gap creation places in the circuit data, and an air gap creation prohibition constraint specifying an area in the circuit data in which air gap creation is prohibited; the detection step of detecting an air gap creation place located in the area specified by the air gap creation prohibition constraint, from the air gap creation places indicated by the air gap creation place information; and the error-place output step of outputting information in which the air gap creation place detected in the detection step is indicated as an error place.

In this inventive semiconductor integrated circuit design support method, it is possible to check the adequacy of the air gap creation places in the design process of the semiconductor integrated circuit, thereby identifying inadequate air gap creation places.

In another aspect of the present invention, a method for supporting design of a semiconductor integrated circuit having air gaps formed therein includes: the input step of receiving circuit data, air gap information, and an air gap volume constraint, the circuit data being data in which logic cells are placed and connected with each other by wires, the air gap information indicating air gap creation places and air gap volume values in the circuit data, the air gap volume constraint specifying an allowable range for an air gap volume value; the calculation step of calculating the sum total of air gap volume values in each of a plurality of check areas obtained by dividing an area in the circuit data, in accordance with the air gap information; the detection step of detecting, from the check areas, a check area in which the sum total of the air gap volume values calculated in the calculation step falls outside the allowable range specified by the air gap volume constraint; and the error-area output step of outputting error-area information in which the check area detected in the detection step is indicated as an error area.

In this inventive semiconductor integrated circuit design support method, it is possible to check the adequacy of air gap volume values in the design process of the semiconductor integrated circuit, thereby identifying each place having an inadequate air gap volume value.

In another aspect of the present invention, a method for obtaining a wiring parasitic capacitance in a design process of a semiconductor integrated circuit having air gaps formed therein includes: the input step of receiving circuit data, in which logic cells are placed and connected with each other by wires, air gap information indicating air gap creation places in the circuit data, an air-gap-presence wiring structure file indicating the values of wiring parasitic capacitances that would be obtained when the wiring parasitic capacitances are each calculated in a situation where a created air gap is present between associated wires, and an air-gap-absence wiring structure file indicating the values of wiring parasitic capacitances that would be obtained when the wiring parasitic capacitances are each calculated in a situation where no air gap is created between associated wires; the selection step of selecting one of the wires described in the circuit data; the determination step of determining, according to the air gap information, whether or not an air gap is created in an area between the wire selected in the selection step and a wire adjacent to the selected wire in the circuit data; and the wiring parasitic capacitance calculation step of, if it is determined in the determination step that an air gap is created in the area between the wires, obtaining a wiring parasitic capacitance using the air-gap-presence wiring structure file, and if it is determined in the determination step that no air gap is created in the area between the wires, obtaining a wiring parasitic capacitance using the air-gap-absence wiring structure file.

In the inventive wiring parasitic capacitance calculation method, it is possible to obtain a wiring parasitic capacitance according to whether or not an air gap is created. Thus, the wiring parasitic capacitance value is calculated accurately in the design process of the semiconductor integrated circuit.

BRIEF DESCRIPTION OF THE DRAWINGS

FIG. 2 shows an example of an air gap volume constraint.

FIGS. 3A and 3B show examples of cell information (cell areas and air gap volumes).

FIGS. 6A and 6B show examples of an air gap creation condition.

FIGS. 7A and 7B show examples of an air gap calculation method.

FIGS. 8A and 8B show examples of an air gap volume constraint.

FIGS. 13A and 13B show other examples of the air gap creation condition.

FIG. 16 shows an example of description of an air gap creation prohibition constraint.

FIG. 17 shows an example of description of an air gap non-creation instruction.

FIG. 18 shows an example of description of an air gap creation instruction.

FIG. 19 shows an example of description of air gap representation information.

FIGS. 23A and 23B show examples of a cell air gap creation prohibition constraint.

FIGS. 24A and 24B show examples of a cell air gap non-creation instruction.

DETAILED DESCRIPTION OF THE INVENTION

Figure 1:
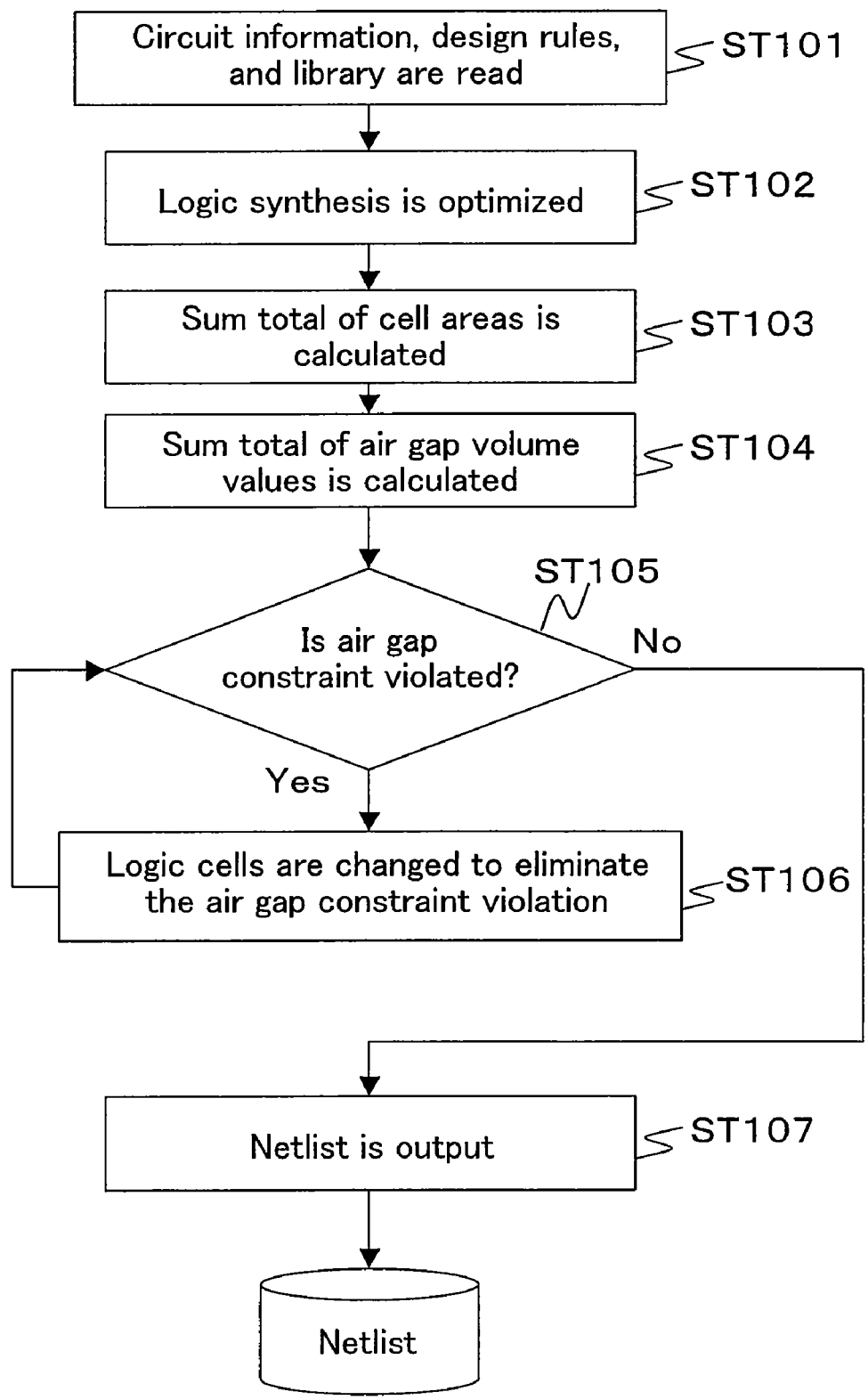
FIG. 1 is a flowchart for a method for designing a semiconductor integrated circuit according to a first embodiment of the present invention.

Hereinafter, embodiments of the present invention will be described in detail with reference to the accompanying drawings. In the drawings, the same or equivalent members are identified by the same reference numerals, and the description thereof will not be repeated.

First Embodiment

FIG. 1 is a flowchart for a method for designing a semiconductor integrated circuit according to a first embodiment of the present invention. In this semiconductor integrated circuit design method, a netlist is created and optimized based on circuit information in RTL description and based on design constraints, and air gap volume values in the netlist are optimized. This semiconductor integrated circuit design method is implemented by a device (for example, a semiconductor integrated circuit design device) incorporating, e.g., input/output sections, a CPU, a database, a display, etc, or by a program for operating such a device. The same is also true for the other embodiments described later.

<Input Information>

A semiconductor integrated circuit design device receives circuit information in RTL description, design rules, and a library. In the design rules, design constraints and an air gap constraint are described. The design constraints are general constraints (such as a delay constraint, a power consumption constraint, etc.) for semiconductor integrated circuits. In the library, cell information is described.

[Air Gap Constraint]

The air gap constraint is information which specifies the allowable ranges of the sum total of air gap volume values. For example, as shown in FIG. 2, the air gap constraint specifies the ranges of the sum total of cell areas and the corresponding allowable ranges (the upper and lower limits) of the sum total of air gap volume values.

[Cell Information]

As shown in FIG. 3A, the cell information specifies the cell areas of logic cells and the volume of an air gap or air gaps created in each of the logic cells. The air gap volumes are defined as numerical values (volume values) as shown in FIG. 3B, for example.

<Operation>

Next, with reference to FIG. 1, the semiconductor integrated circuit design method according to this embodiment will be described.

[Step ST101]

First, the circuit information in RTL description, the design rules, in which the design constraints and the air gap constraint are described, and the library, in which the cell information is described, are read.

[Step ST102]

Then, logic synthesis is performed according to the circuit information. And the netlist is optimized in such a manner that the design constraints described in the design rules are not violated. Specifically, if a design constraint is violated, a logic cell or cells described in the netlist are changed to another logic cell or cells so that the violation is eliminated. For instance, when the amount of delay in the netlist exceeds the allowable value of the amount of delay specified in the delay constraint, a logic cell or cells described in the netlist are changed to a logic cell or cells having a smaller amount of delay than that logic cell or cells.

[Step ST103]

Next, for each logic cell described in the netlist, the cell area of that logic cell is detected from the cell information described in the library to obtain the sum total of the detected cell areas. In this manner, the sum total of the cell areas in the netlist is calculated.

[Step ST104]

Subsequently, for each logic cell described in the netlist, an air gap volume value in that logic cell is detected from the cell information described in the library, and the sum total of the detected air gap volume values is calculated. In this manner, the sum total of the air gap volume values in the netlist is calculated.

[Step ST105]

Next, the allowable range of air gap volume value corresponding to the sum total of the cell areas calculated in Step ST103 is detected from the air gap constraint described in the design rules. Then, it is determined whether or not the sum total of the air gap volume values calculated in Step ST104 is within the allowable range. That is, it is determined whether or not the netlist optimized in Step ST102 violates the air gap constraint. If the optimized netlist violates the air gap constrain, the process proceeds to Step ST106. If the optimized netlist does not violate the air gap constrain, the process proceeds to Step ST107.

[Step ST106]

In the case of the violation of the air gap constraint, one or more (or all) of the logic cells described in the netlist are changed to a logic cell or cells having a different air gap volume value from that logic cell or cells, so that the sum total of the air gap volume values falls within the allowable range. For example, when the sum total of the air gap volume values is higher than the upper limit of the allowable range, a logic cell or cells having a smaller air gap volume value than a logic cell or cells described in the netlist are selected. When the sum total of the air gap volume values is lower than the lower limit of the allowable range, a logic cell or cells having a larger air gap volume value than a logic cell or cells described in the netlist are selected. These logic cell changes are made within a range that allows the netlist to have the same logic. In this step, it is desirable that the processing (the netlist optimization based on the design constraints) in Step ST102 be also carried out together. Next, when the logic cell changes are complete, the process proceeds to Step ST105.

[Step ST107]

In the case of the determination in Step ST105 that the air gap constraint is not violated, the netlist is output.

Specific Example

Now, with reference to FIGS. 4A and 4B, the semiconductor integrated circuit design method shown in FIG. 1 will be described more specifically.

Figure 4A:
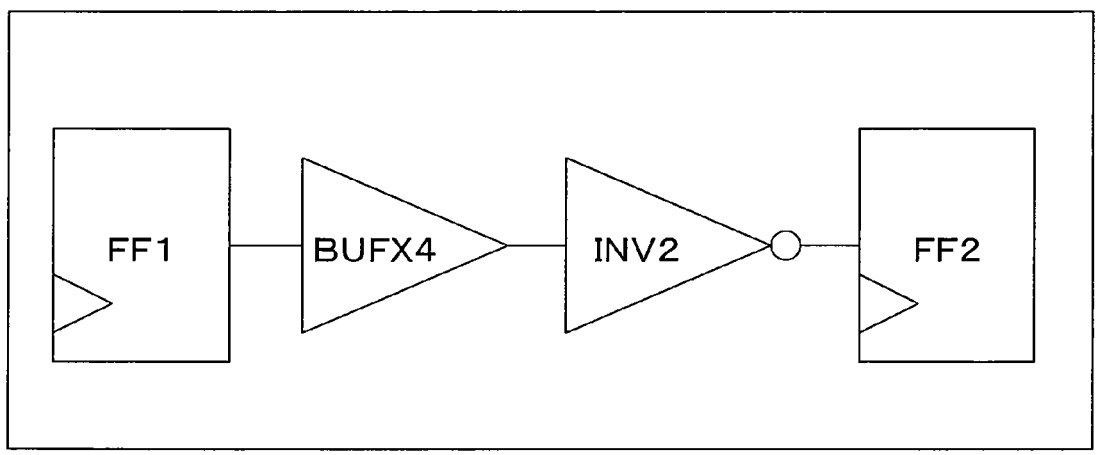
FIGS. 4A and 4B are explanatory views of optimization of air gap volume values in the semiconductor integrated circuit design method shown FIG. 1.

First, it is assumed that as a result of the optimization of the netlist according to the design constraints (in Step ST102), logic cells FF1, BUFX4, INV2, and FF2 are described in the netlist as shown in FIG. 4A.

Then, after the processing in Steps ST103 and ST104, the sum total of cell areas and the sum total of air gap volume values in the netlist are calculated. In this case, the sum total of cell areas is 9, and the sum total of air gap volume values is 1.1.

Subsequently, in Step ST105, the allowable range (which is from 0.5 to 1.0) of the sum total of air gap volume values that corresponds to the sum total of the cell areas (which is 9) is detected from the air gap constraint. In this case, the sum total of the air gap volume values is 1.1 and exceeds the upper limit (which is 1.0) of the allowable range, which means that the air gap constraint is violated.

Figure 4B:
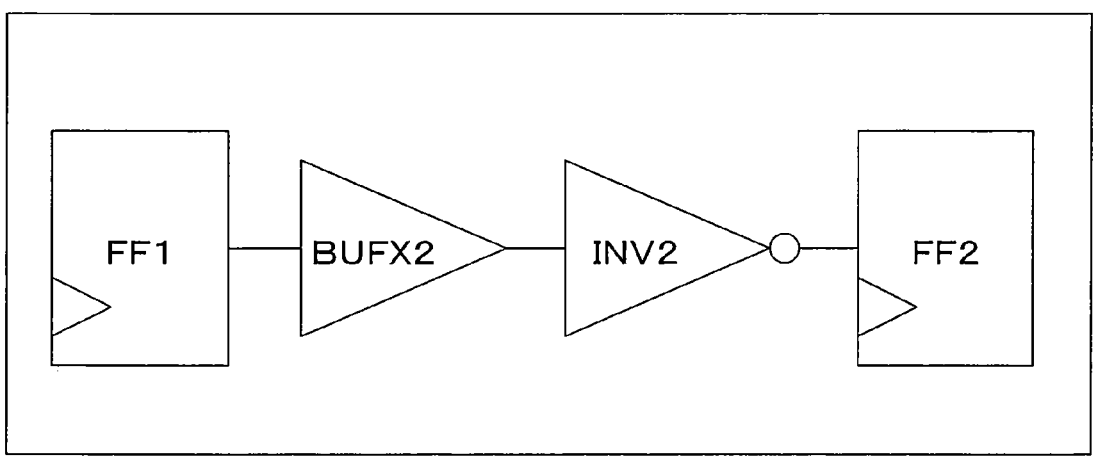

Thus, as shown in FIG. 4B, in Step ST106, the logic cell BUFX4 whose air gap volume value is 0.5 is replaced with a logic cell BUFX2 whose air gap volume value is 0.2 in order to reduce the sum total of the air gap volume values. As a result, the sum total of the cell areas is 8, and the sum total of the air gap volume values is 0.8. In this way, the logic cells described in the netlist are changed to eliminate the air gap constraint violation.

<Effects>

As described above, it is possible to control the air gap volume values in the design process of the semiconductor integrated circuit, which enables the design of the semiconductor integrated circuit having the air gaps appropriately formed therein.

Furthermore, by providing the air gap volume constraint in the logic synthesis process, the air gap volume values can be checked in the stage prior to the layout design process. The air gap volume values are thus modifiable in the logic synthesis process, thereby allowing the time required for the design process to be shortened.

Second Embodiment

Figure 5:
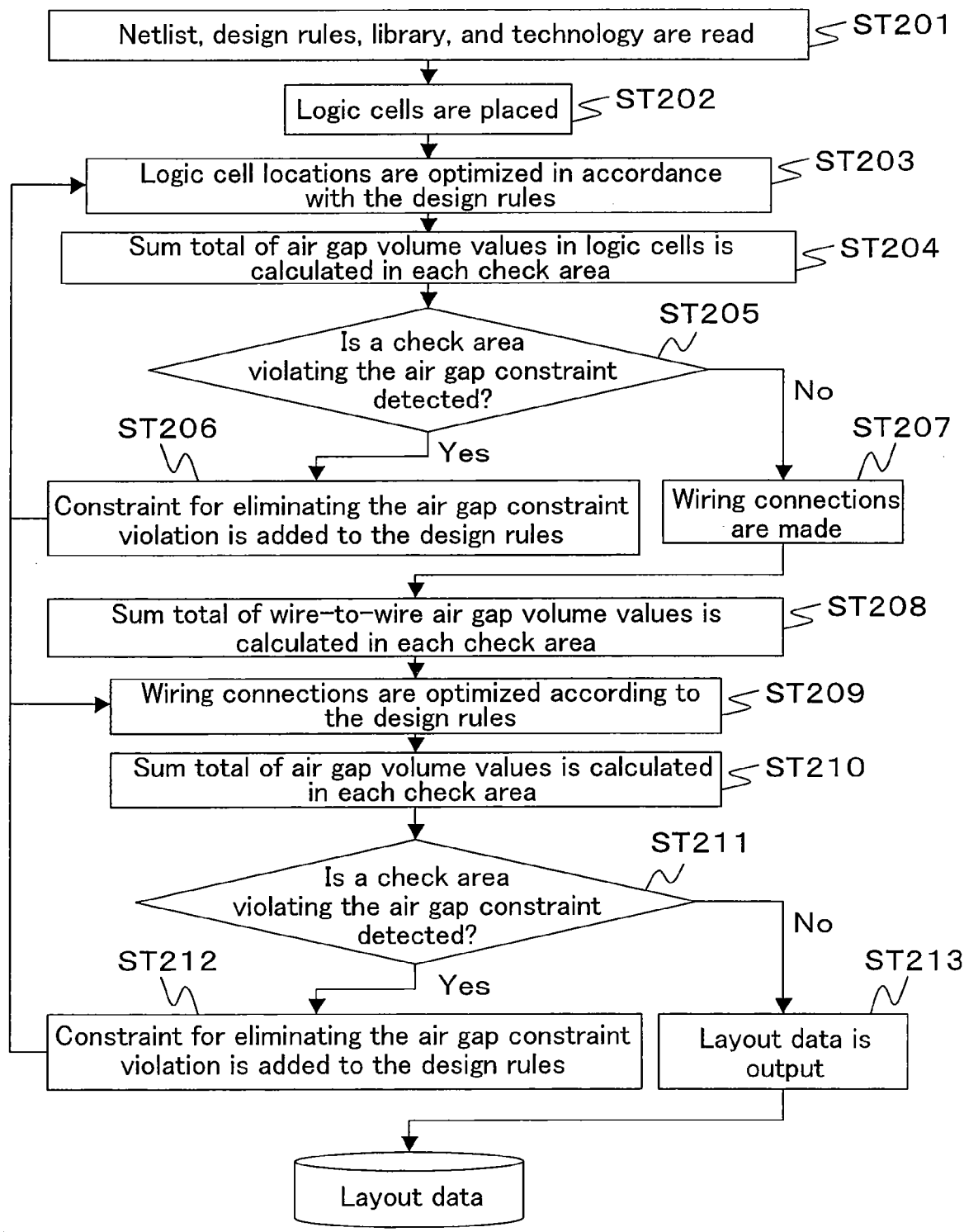
FIG. 5 is a flowchart for a method for designing a semiconductor integrated circuit according to a second embodiment of the present invention.

FIG. 5 is a flowchart for a method for designing a semiconductor integrated circuit according to a second embodiment of the present invention. In this semiconductor integrated circuit design method, according to a netlist and design constraints, layout data is created, and logic cell locations and wiring connections, as well as air gap volume values, in the layout data are optimized. In this semiconductor integrated circuit design method, a chip area on the layout data is divided into a plurality of check areas, and the adequacy of air gap volume values in each check area is checked.

<Input Information>

A semiconductor integrated circuit design device receives a netlist created through a logic synthesis process, design rules, and a library.

In the design rules, design constraints specifying general constraints (such as a delay constraint, a power consumption constraint, etc.) for a semiconductor integrated circuit, an air gap creation condition, an air gap calculation method, and an air gap constraint are described. In the library, cell information is described.

[Air Gap Creation Condition]

The air gap creation condition is information which defines a condition for air gap creation. To be specific, an air gap is created in a place where the air gap creation condition is satisfied. In the air gap creation condition, as shown in FIG. 6A, for example, whether or not an air gap is created is defined by the facing interval (i.e., the distance between wires) and the facing length (i.e., the length of an area in which the facing interval is the same). In this case, the air gap creation condition may be described as shown in FIG. 6B so that the CPU in the semiconductor integrated circuit design device can process the air gap creation condition.

[Air Gap Calculation Method]

The air gap calculation method is information indicating a definition for calculating air gap volume values. In the air gap calculation method, as shown in FIG. 7A, for example, the air gap volume values are defined by the facing interval and the facing length. In this case, the air gap calculation method may be described as shown in FIG. 7B so that the CPU in the semiconductor integrated circuit design device can process the air gap calculation method.

[Air Gap Constraint]

The air gap constraint is information specifying the allowable ranges of the sum total of air gap volume values. For example, as shown in FIG. 8A, the air gap constraint specifies the size of each check area which is checked for violation of the air gap constraint, and the allowable range (the upper and lower limits) of the sum total of air gap volume values that corresponds to that area size. Also, as shown in FIG. 8B, in the air gap constraint, the correlation between the size of a check area and the allowable range of the sum total of air gap volume values that corresponds to that area size may be described for each wiring layer.

[Cell Information]

Figure 9:
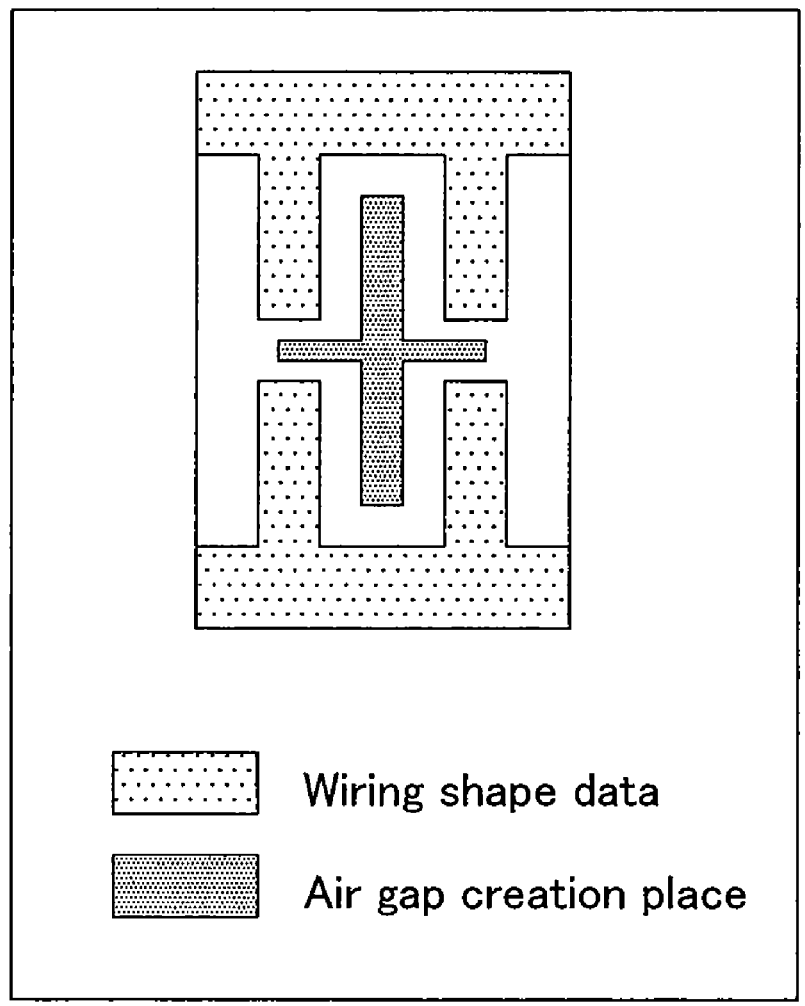
FIG. 9 shows an example of the physical shape of an air gap creation place described in cell information.

The cell information specifies an air gap volume value for each logic cell. As shown in FIGS. 3A and 3B, for example, in the cell information, the air gap volume values for the respective logic cells may be described as numerical values, or as shown in FIG. 9, a place where an air gap is created (i.e., an air gap creation place) in a logic cell and the value of the volume of the air gap may be described as physical shapes. In the following example described in this embodiment, processing is performed using cell information in which air gap volume values are provided as numerical values as shown in FIGS. 3A and 3B.

<Operation>

Next, with reference to FIG. 5, the semiconductor integrated circuit design method according to this embodiment will be discussed. In this embodiment, it is assumed that, of the design rules, the air gap creation condition and the air gap calculation method are described in a technology.

[Step ST201]

First, the netlist, the design rules in which the design constraints and the air gap constraint are described, the library in which the cell information is described, and the technology in which the air gap creation condition and the air gap calculation method are described are read.

[Step ST202]

Next, the locations of logic cells are decided according to the netlist, and the decided logic cell locations are described in layout data.

[Step ST203]

Then, the logic cell locations are optimized in such a manner that the design constraints described in the design rules are not violated. For instance, a cell or cells in which constraints as to timing and as to wiring congestion are violated are moved to a different area. In optimizing delay, wiring-capacitance reduction effect produced by air gaps is also taken into account. Specifically, in accordance with the placement location of each logic cell, virtual wiring paths are assumed to exist in the placement stage, and the wiring parasitic capacitance of a virtual wiring path passing through an area congested with logic cells placed therein is underestimated. The reason for the underestimation of the wiring parasitic capacitance is that air gaps are likely to be created in the area having the placement congestion.

[Step ST204]

Next, for each logic cell placed on the layout data, an air gap volume value in that logic cell is detected from the cell information described in the library. Then, the sum total of the air gap volume values in each check area is calculated.

[Step ST205]

Subsequently, for each of the check areas, the allowable range of the sum total of air gap volume values that corresponds to the area size of that check area is detected from the air gap constraint described in the design rules. Next, for each check area, it is determined whether or not the sum total of the air gap volume values calculated in Step ST204 is within the allowable range. That is, in each check area, whether or not the air gap constraint is violated is checked. In a case where there is a wiring layer only used in logic cells, by referring to the cell information described in the library, checking for violation of the air gap constraint for that wiring layer can be performed just with the logic cell placement results. If an area or areas violating the air gap constraint are detected, the process proceeds to Step ST206, and if not, the process proceeds to Step ST207.

[Step ST206]

In the case of the detection of a check area or areas violating the air gap constraint, a constraint or constraints (a violation elimination constraint or constraints) for eliminating the air gap constraint violation in the detected check area or areas are added to the design constraints. That is, a constraint for bringing the sum total of the air gap volume values in each check area violating the air gap constraint within the corresponding allowable range specified by the air gap constraint is added. For example, for a check area in which the sum total of the air gap volume values exceeds the upper limit, a constraint for making the placement density value in that check area be smaller than the current value may be added. Alternatively, a constraint for changing a logic cell or cells placed in that check area to a logic cell or cells having a smaller air gap volume may be added. On the other hand, for a check area in which the sum total of the air gap volume values falls below the lower limit, a constraint for making the placement density value in that check area be greater than the current value may be added. Alternatively, a constraint for changing a logic cell or cells placed in that check area to a logic cell or cells having a larger air gap volume may be added. When the addition of the violation elimination constraint or constraints is complete, the process proceeds to Step ST203.

[Step ST207]

In the case where no areas violating the air gap constraint are detected in Step ST205, wiring connections are made for the logic cells (including function macros in some cases) placed on the layout data. The logic cells are thus connected by the wires.

[Step ST208]

Next, in accordance with the air gap calculation method described in the technology, air gap volume values in places (air gap creation places) where the air gap creation condition is satisfied are calculated. In this way, air gap volume values between wires are obtained. Then, the sum total of the wire-to-wire air gap volume values is calculated in each check area.

[Step ST209]

Subsequently, the logic cells, the placement locations of the logic cells, the wiring lengths, the number of vias, and the wiring paths are changed in such a manner that the design constraint described in the design rules are not violated, so as to optimize the wiring connections. In optimizing delay, wiring-parasitic-capacitance reduction effect produced by air gaps is also taken into account. To be specific, in a case where an air gap is created between wires, the parasitic capacitance of the wires is underestimated according to the value of the volume of the air gap. Also, for example, when a wiring parasitic capacitance is desired to be lowered to reduce the amount of delay for the optimization of delay, the associated wiring paths may be changed so as to increase the air gap volume value.

[Step ST210]

Next, as in Step ST204, air gap volume values for the logic cells placed on the layout data are detected from the cell information described in the library. And as in Step ST208, places on the layout data where the air gap creation condition described in the technology is satisfied are detected, and air gap volume values in those places (air gap creation places) where the air gap creation condition is satisfied are obtained in accordance with the air gap calculation method described in the technology. Next, in each check area, the sum total of the air gap volume values in the logic cells and the wire-to-wire air gap volume values is calculated.

[Step ST211]

Subsequently, for each check area, the allowable range of the sum total of air gap volume values that corresponds to the area size of that check area is detected from the air gap constraint described in the design rules. Then, for each check area, it is determined whether or not the sum total of the air gap volume values calculated in Step ST210 is within the allowable range. That is, in each check area, whether or not the air gap constraint is violated is checked. If a check area or areas violating the air gap constraint are detected, the process proceeds to Step ST212, and if not, the process proceeds to Step ST213.

[Step ST212]

In the case of the detection of a check area or areas violating the air gap constraint, a constraint or constraints (a violation elimination constraint or constraints) for eliminating the air gap constraint violation in the detected check area or areas are added as a design constraint or constraints to the design rules. That is, a constraint for bringing the sum total of the air gap volume values in each check area violating the air gap constraint within the corresponding allowable range specified by the air gap constraint is added. For example, for a check area in which the sum total of the air gap volume values exceeds the upper limit, a constraint for making the wiring density value in that check area be smaller than the current value is added. On the other hand, for a check area in which the sum total of the air gap volume values falls below the lower limit, a constraint for making the wiring density value in that check area be greater than the current value is added. If a violation elimination constraint as to the wiring connection has been added in this way, the process proceeds to Step ST209. In this step, in order to eliminate the air gap constraint violation, a violation elimination constraint as to the logic cell location may also be added as in Step ST206. In that case, the process may proceed to Step ST203.

[Step ST213]

In the case where no check areas violating the air gap constraint are detected in Step ST211, the layout data is output.

Specific Example

Next, the semiconductor integrated circuit design method indicated in FIG. 5 will be described by giving a specific example.

[Elimination of Air Gap Constraint Violation in Placement Stage]

First, with reference to FIGS. 10A and 10B, a description will be made of elimination of air gap constraint violations in the placement stage.

Figure 10A:
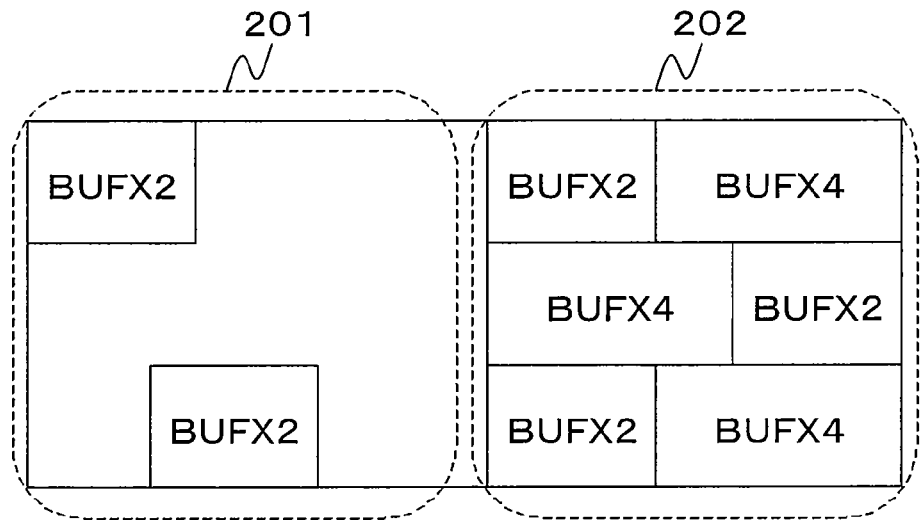
FIGS. 10A and 10B are explanatory views of optimization of air gap volume values in a placement stage in the semiconductor integrated circuit design method shown in FIG. 5.
Figure 10B:
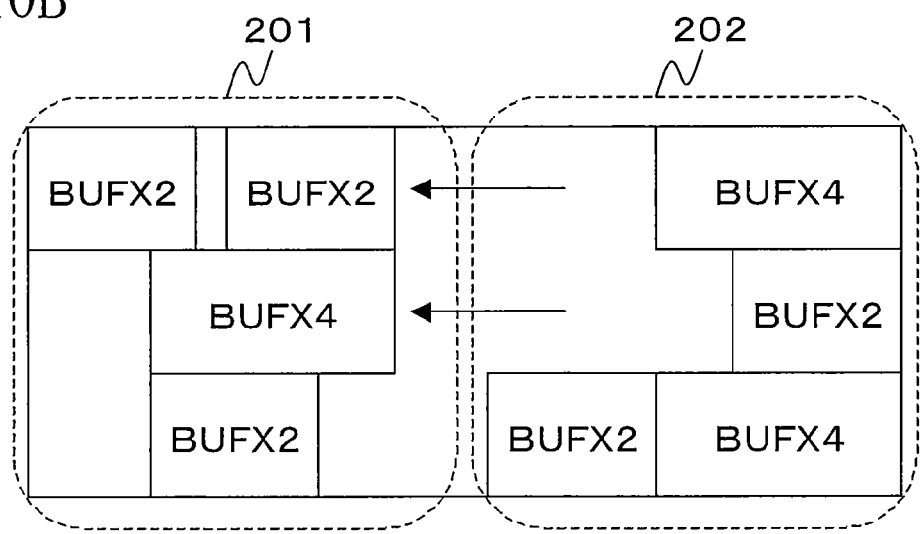

It is assumed that as a result of the optimization of logic cell locations (in Step ST203), logic cells BUFX2 and BUFX4 have been placed in check areas 201 and 202 on the layout data as shown in FIG. 10A.

Next, in Step ST204, referring to the cell information (in FIG. 3A), the sum total of air gap volume values in each of the check areas 201 and 202 is calculated. In this case, the sum total of air gap volume values in the check area 201 is 0.4, and the sum total of air gap volume values in the check area 202 is 2.1.

Subsequently, in Step ST205, it is assumed that the air gap constraint specifies that the allowable range of the sum total of air gap volume values for each of the check areas 201 and 202 is from 1.0 to 2.0. In this case, the sum total of air gap volume values in the check area 201 (which is 0.4) falls below the lower limit (which is 1.0) of the allowable range, while the sum total of air gap volume values in the check area 202 (which is 2.1) exceeds the upper limit (which is 2.0) of the allowable range.

Thus, in Step ST206, a constraint for increasing the placement density value in the check area 201, and a constraint for decreasing the placement density value in the check area 202 are added to the design rules. Consequently, in Step ST203, the locations of the logic cells are changed in such a manner that the newly added constraints are not violated; logic cells BUFX2 and BUFX4 located in the check area 202 are moved to the check area 201 as shown in FIG. 10B. As a result, the sum total of the air gap volume values in the check area 201 is increased to 1.1, while the sum total of the air gap volume values in the check area 202 is decreased to 1.4. In this way, the air gap constraint violation in each check area is eliminated.

[Wiring Connection Optimization Performed Considering Air Gaps]

Next, optimization of wiring connections performed with consideration given to air gaps will be discussed with reference to FIGS. 11A and 11B.

Figure 11A:
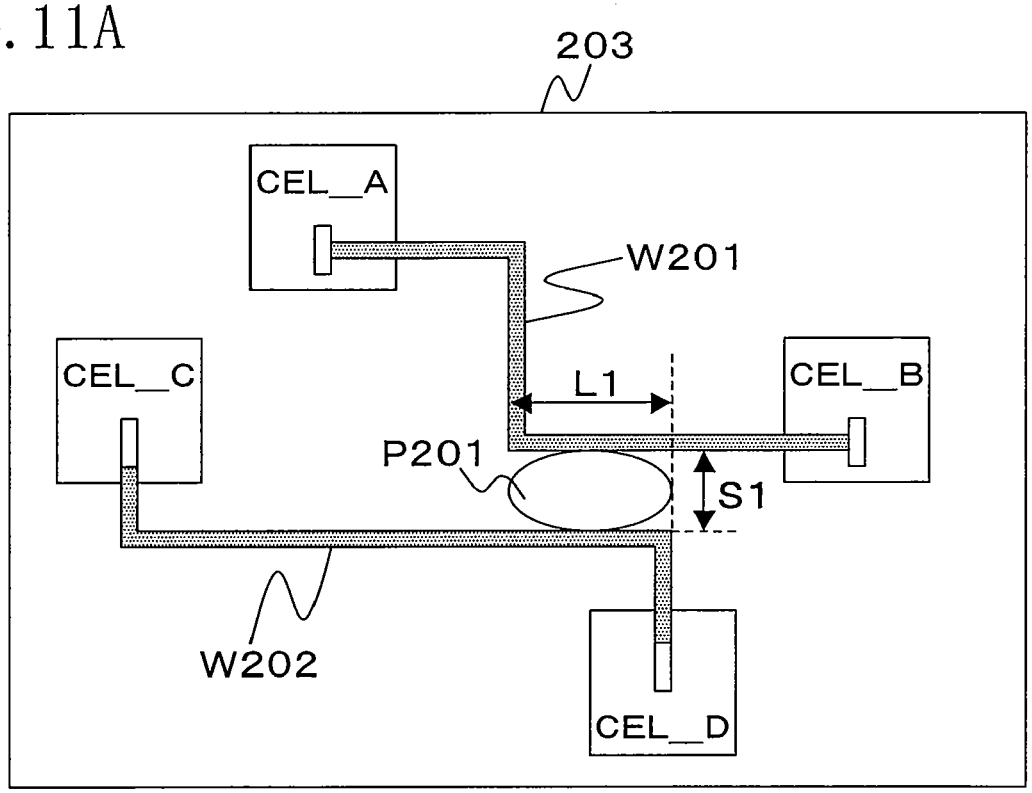
FIGS. 11A and 11B are explanatory views of optimization of wiring connections performed with consideration given to air gap formation in the semiconductor integrated circuit design method shown in FIG. 5.
Figure 11B:
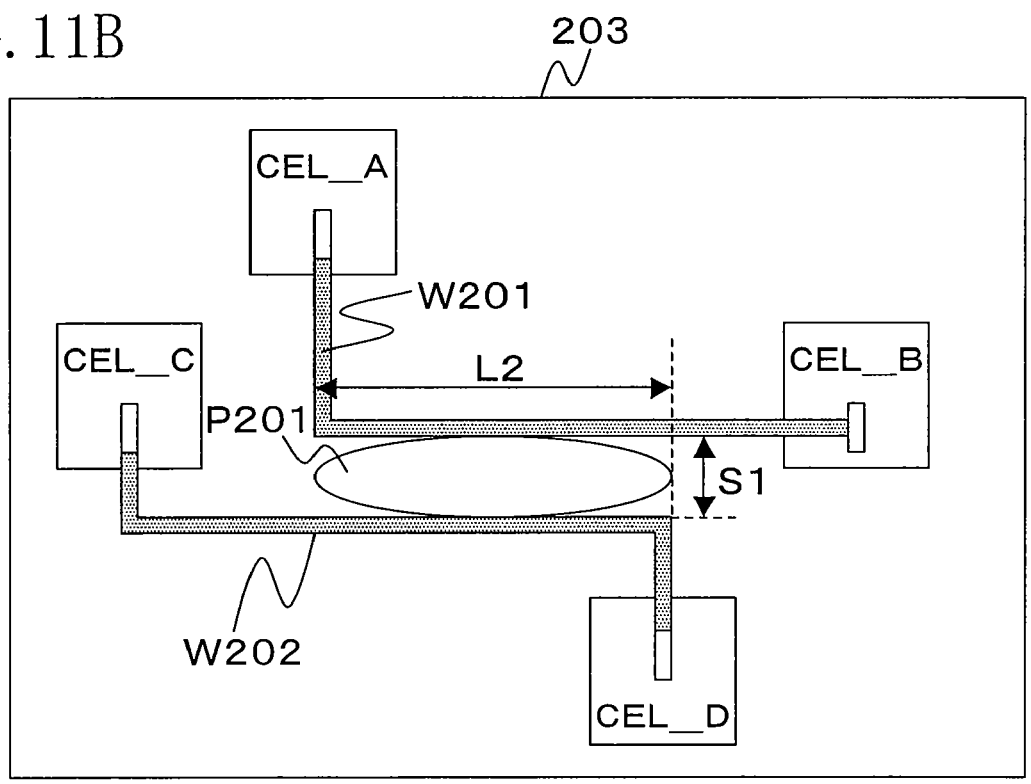

First, it is assumed that as a result of the wiring connections (in Step ST207), a wire W201 has been connected between logic cells CEL_A and CEL_B, and a wire W202 has been connected between logic cells CEL_C and CEL_D, as shown in FIG. 11A.

Then, in Step ST208, the air gap creation condition (in FIG. 6A) is satisfied in a place P201 where the wire-to-wire distance thereof (i.e., the facing interval) is S1 and the facing length thereof is L1, and an air gap volume value in the place P201 is calculated according to the air gap calculation method. In this case, the air gap volume value in the place P201 is 0.1.

If the amount of delay estimated in an area 203 is lower than the allowable value of the amount of delay specified in the delay constraint, the facing length of the wires W201 and W202 is increased from L1 to L2 in Step ST209 as shown in FIG. 13B so as to raise the air gap volume value between the wires W201 and W202. As a result, the air gap volume value in the place P201 is increased to 0.2 to reduce the amount of delay estimated in the area 203, thereby eliminating the delay constraint violation.

[Elimination of Air Gap Constraint Violation in Wiring Stage]

Next, with reference to FIGS. 12A and 12B, a description will be made of elimination of air gap constraint violations in the wiring stage.

Figure 12A:
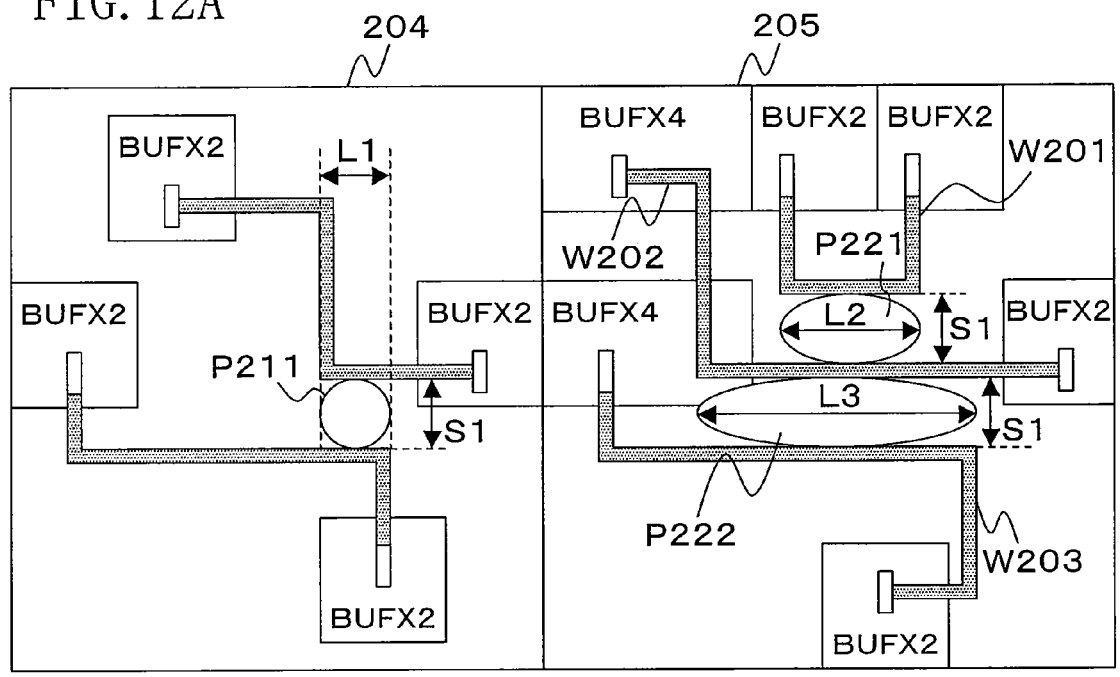
FIGS. 12A and 12B are explanatory views of optimization of air gap volume values in a wiring stage in the semiconductor integrated circuit design method shown in FIG. 5.
Figure 12B:
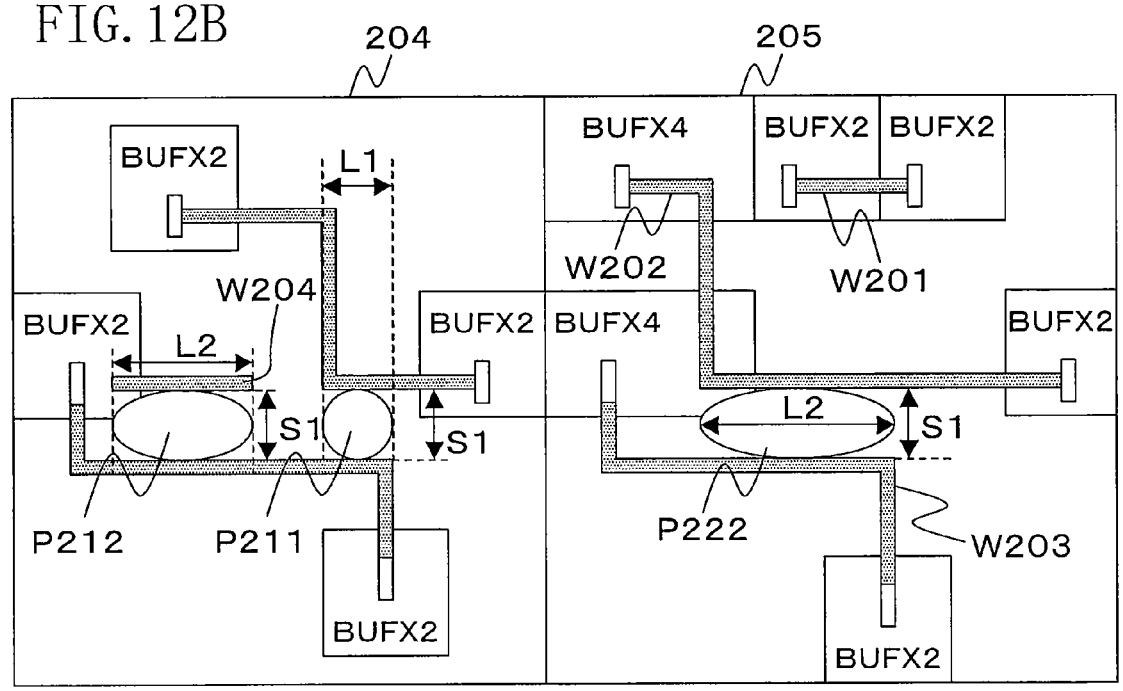

First, it is assumed that as a result of the optimization of the wiring connections (in Step ST209), wires have been connected as shown in FIG. 12A in check areas 204 and 205.

Next, in Step ST210, the sum total of air gap volume values is calculated in each of the check areas 204 and 205. In this case, in the check area 204, the sum of air gap volume values in four logic cells BUFX2 is 0.2×4=0.8, and an air gap volume value in a place P211 is 0.1. The sum total of the air gap volume values in the check area 204 is thus 0.9. In the check area 205, on the other hand, the sum of air gap volume values in four logic cells BUFX2 is 0.2×4=0.8, the sum of air gap volume values in two logic cells BUFX4 is 0.5×2=1.0, an air gap volume value in a place P221 is 0.2, and an air gap volume value in a place P222 is 0.4. The sum total of the air gap volume values in the check area 205 is thus 2.4.

Subsequently, in Step ST211, it is assumed that the air gap constraint specifies that the allowable range of the sum total of air gap volume values for each of the check areas 204 and 205 is from 1.0 to 2.0. In this case, the sum total of the air gap volume values (which is 0.9) in the check area 204 falls below the lower limit (which is 1.0) of the allowable range, while the sum total of the air gap volume values (which is 2.4) in the check area 205 exceeds the upper limit (which is 2.0) of the allowable range.

Thus, in Step ST212, a constraint for lowering the placement density value in the check area 204, and a constraint for raising the placement density value in the check area 205 are added to the design rules. Consequently, in Step ST209, the wiring connection is changed in such a manner that the newly added constraints are not violated as shown in FIG. 12B. A dummy metal W204 is added in the check area 204, and the wiring paths of the wires W201 and W203 are changed in the check area 205. Thus, in the check area 204, a place P212 (having an air gap volume value of 0.2) where the air gap creation condition is satisfied is newly produced to cause the sum total of the air gap volume values in the check area 204 to increase to 1.1. In the check area 205, on the other hand, the space between the wires W201 and W202 is increased, such that the place P221 (having an air gap volume value of 0.2) where the air gap creation condition is satisfied disappears, and the facing length of the wires W202 and W203 decreases to L2 to thereby lower the air gap volume value in the place P222 to 0.2. As a result, the sum total of the air gap volume values in the check area 205 is decreased to 2.0. In this way, the air gap constraint violation in each check area is eliminated.

<Effects>

As described above, it is possible to control the air gap volume values in the design process of the semiconductor integrated circuit, which enables the design of the semiconductor integrated circuit having the air gaps appropriately formed therein.

Furthermore, by providing the air gap volume constraint in the layout design process, the air gap volume values, as well as the logic cell locations and the wiring connections, can be optimized, which allows the time required for the design process to be shortened.

In Step ST206 or ST212, as a violation elimination constraint, an air gap creation prohibition constraint, which specifies an area or areas (an air gap creation prohibition area or areas) where satisfaction of the air gap creation condition is prohibited, may be added to or deleted from the design rules. Specifically, in an area (an air gap creation prohibition area) specified by the air gap creation prohibition constraint, logic cell location changes and the like are performed in such a manner that the air gap creation condition is not satisfied. Thus, no air gap is created in the air gap creation prohibition area. In this way, air gap volume values are adjustable.

Also, as shown in FIG. 13A, in the air gap creation condition, the wire-to-wire distance (i.e., the facing interval) may be associated with air gap creation or non-creation. In this case, the air gap creation condition may be described as shown in FIG. 13B so that the CPU in the semiconductor integrated circuit design device can process the air gap creation condition.

Third Embodiment

Figure 14:
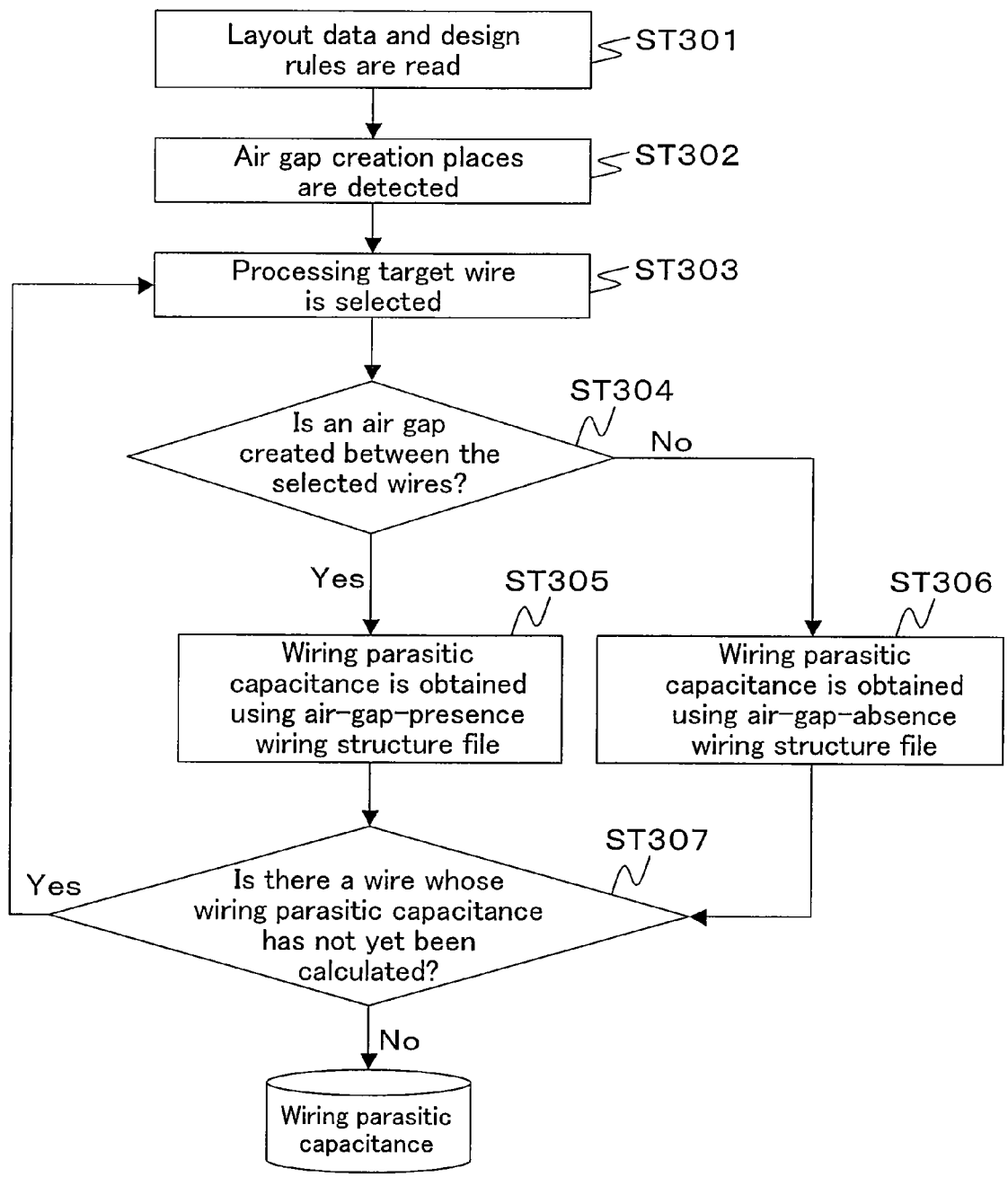
FIG. 14 is a flowchart for a method for calculating a wiring parasitic capacitance according to a third embodiment of the present invention.

FIG. 14 is a flowchart for a method for calculating a wiring parasitic capacitance according to a third embodiment of the present invention. In this wiring parasitic capacitance calculation method, when the value of a wiring parasitic capacitance in layout data, in which logic cells have been placed and connected to each other by wires, is calculated, a wiring structure file for use in the wiring parasitic capacitance calculation is changed according to whether or not an air gap is created between the wires.

<Input Information>

A wiring parasitic capacitance calculation device receives layout data produced through a layout design process, design rules, and a wiring structure file. In the design rules, an air gap creation condition (see FIGS. 6A and 6B) defining a condition for an air gap creation place is described. The wiring structure file includes two files: a wiring structure file for use when there is an air gap (hereinafter referred to as an "air-gap-presence wiring structure file), and a wiring structure file for use when there is no air gap (hereinafter referred to as an "air-gap-absence wiring structure file). With the air-gap-presence wiring structure file, it is possible to obtain the value of a wiring parasitic capacitance that would be calculated in a situation where an air gap is actually created between wires.

<Operation>

Next, with reference to FIG. 14, the wiring parasitic capacitance calculation method according to this embodiment will be discussed.

[Step ST301]

First, the layout data, the design rules, in which the air gap creation condition is described, and the wiring structure file are read.

[Step ST302]

Figures 15A, 15B:
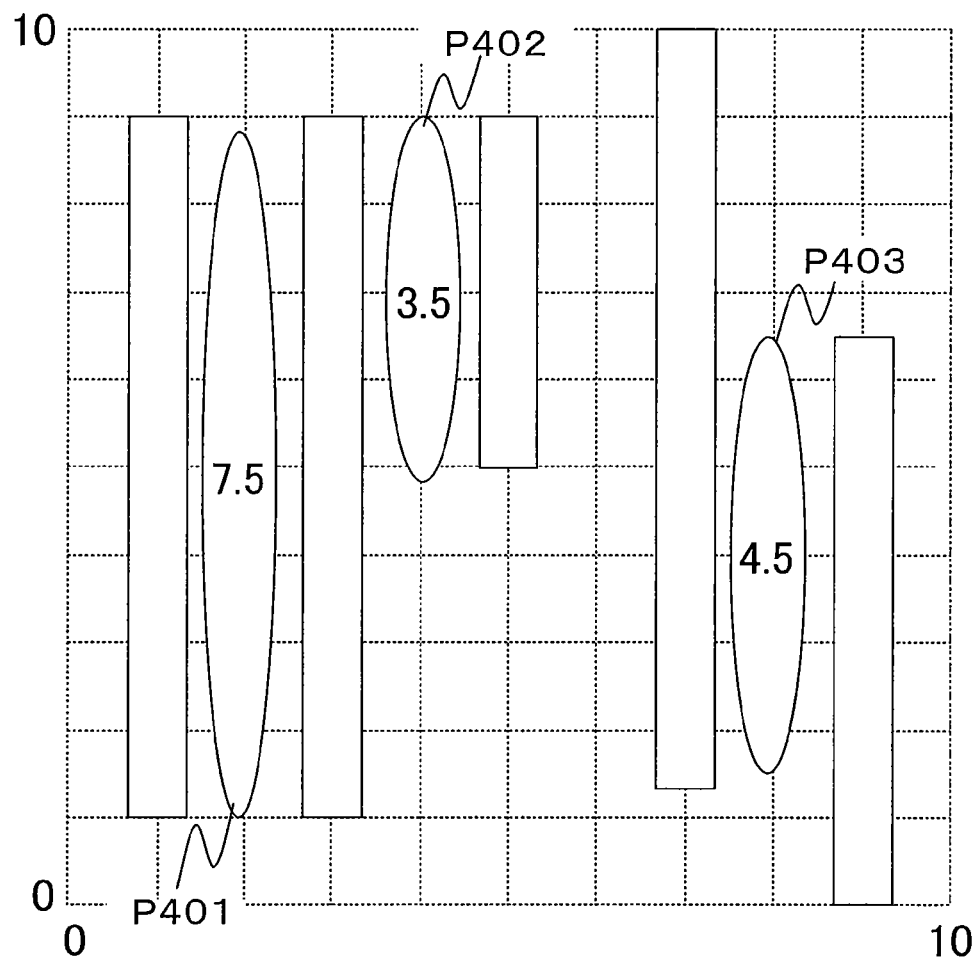
FIG. 15A shows an example of layout data displayed on a display.
FIG. 15B shows an example of air gap creation place information.

Next, places in the layout data where the air gap creation condition described in the design rules is satisfied are detected and the detected places are stored in a database as air gap creation places. For example, as shown in FIG. 15A, when air gap creation places P401, P402 and P403 are detected, the central coordinates and the horizontal and vertical dimensions (the facing interval between the wires and the facing length of the wires) of each air gap creation place are obtained with a corner of a rectangular chip area on the layout data (e.g., the lower left corner of the chip area when the layout data is displayed on the display) serving as the origin point. That is, information (air gap creation place information) that indicates the air gap creation places by the central coordinates and the horizontal and vertical dimensions of the air gap creation places is stored in the database.

[Step ST303]

Subsequently, a wire whose wiring parasitic capacitance is to be calculated is selected from the wires in the layout data.

[Step ST304]

Then, it is determined, by using the air gap creation place information stored in the database, whether or not a place between the wire selected in Step ST303 and a wire adjacent to that selected wire is an air gap creation place. If an air gap is created between these wires, the process proceeds to Step 305. If no air gap is created between these wires, the process proceeds to Step 306.

[Step ST305]

In the case of the determination in Step ST304 that an air gap is created between the wires, the value of the wiring parasitic capacitance is obtained using the air-gap-presence wiring structure file. Then, the process proceeds to Step ST307.

[Step ST306]

On the other hand, in the case of the determination in Step ST304 that no air gap is created between the wires, the value of the wiring parasitic capacitance is obtained using the air-gap-absence wiring structure file. Then, the process proceeds to Step ST307.

[Step ST307]

Next, if the wiring parasitic capacitance calculation processing has been performed for all wires in the layout data, the processing is terminated. If there is a wire or wires for which the wiring parasitic capacitance calculation processing has not yet been performed, the process proceeds to Step ST303.

<Effects>

As described above, it is possible to obtain wiring parasitic capacitances according to whether or not an air gap is created. Thus, the wiring parasitic capacitance values are calculated accurately in the design process of the semiconductor integrated circuit.

In a case in which a single wire has both a place where an air gap is created and a place where no air gap is created between that single wire and an adjacent wire, that single wire may be divided into segments so that a wiring parasitic capacitance can be calculated for each segment. For example, for a segment in which an air gap is created, the wiring parasitic capacitance thereof is calculated using the air-gap-presence wiring structure file, and for a segment in which no air gap is created, the wiring parasitic capacitance thereof is calculated using the air-gap-absence wiring structure file.

Also, an air gap creation prohibition constraint, an air gap non-creation instruction, an air gap creation instruction, and air gap representation information may be described in the design rules. Alternatively, the air gap creation prohibition constraint, the air gap non-creation instruction, the air gap creation instruction, and the air gap representation information may be described in a technology. Each of these information pieces will be discussed later.

In this embodiment, if the air gap non-creation instruction or the air gap creation prohibition constraint is described in the design rules, an area or areas specified by the air gap non-creation instruction or by the air gap creation prohibition constraint may be removed from the wire detection range in Step ST302. In that case, the wiring parasitic capacitances of wires existing in that removed area or areas are obtained using the air-gap-absence wiring structure file. Then, the detection time is shortened.

Furthermore, in this embodiment, if the air gap creation instruction or the air gap representation information is described in the design rules, a place or places specified by the air gap creation instruction or by the air gap representation information are stored in the database as an air gap creation place or places, which allows reduction in the number of areas in which whether or not the air gap creation condition is satisfied must be checked for detection of air gap creation places. Thus, in Step ST302, the time required for the air gap creation place detection is shortened.

Moreover, for example, suppose a case in which the air gap creation places in the layout data have already been detected and the air gap creation place information indicating the detected air gap creation places has already been stored in the database in a design process (e.g., in a layout design process, etc.) performed prior to the stage in this embodiment. In that case, the air gap creation places do not have to be detected in Step ST302, and the inputting of the air gap creation condition is thus not necessary in Step ST301.

Fourth Embodiment

Figure 20:
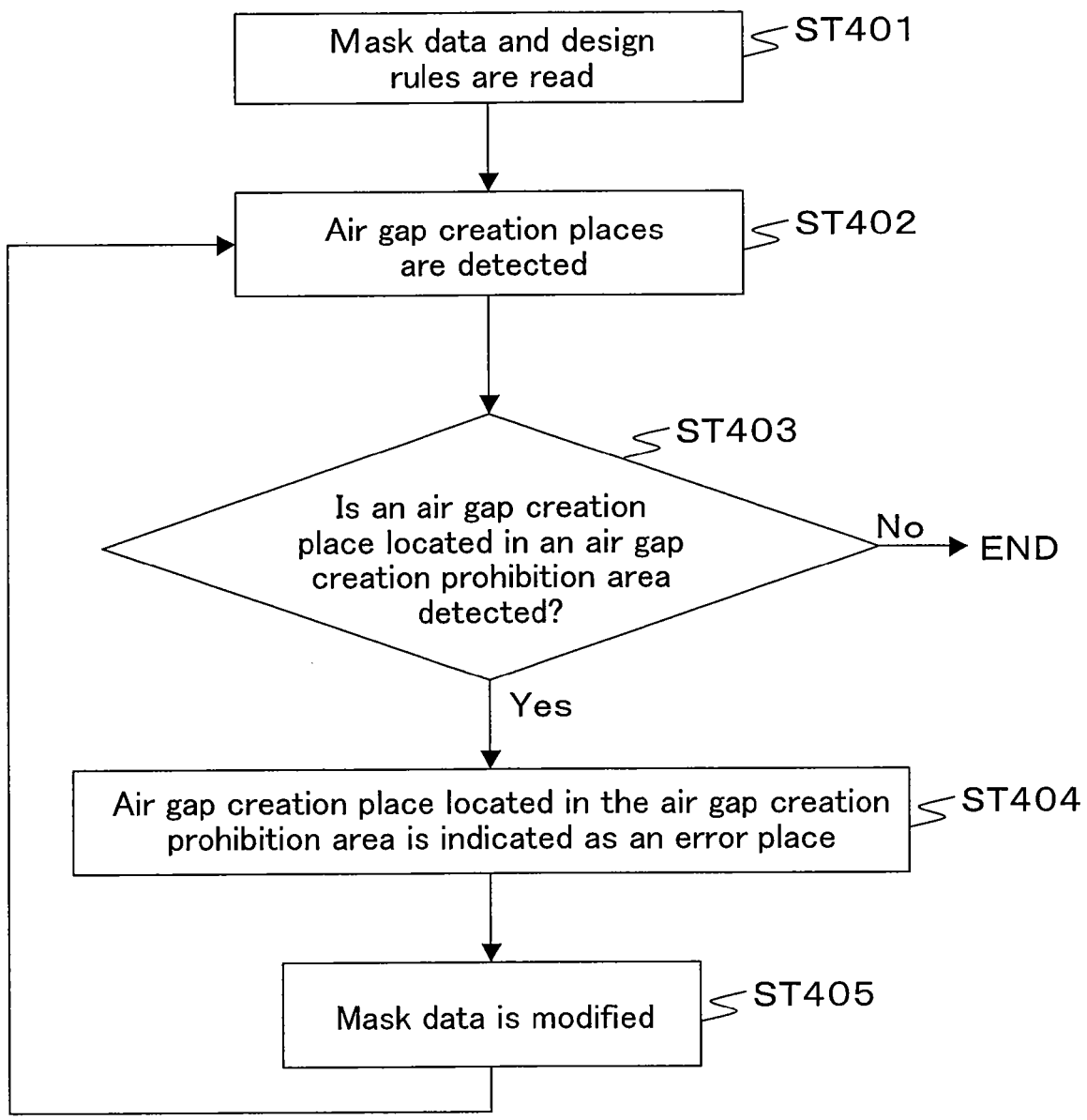
FIG. 20 is a flowchart for a method for supporting design of a semiconductor integrated circuit according to a fourth embodiment of the present invention.

FIG. 20 is a flowchart for a method for supporting design of a semiconductor integrated circuit according to a fourth embodiment of the present invention. In this semiconductor integrated circuit design support method, the adequacy of air gap creation places in mask data (or in layout data), in which logic cells have been placed and wires have been connected to each other, is checked. Although this embodiment will be described by giving mask data as an example, it will easily be appreciated that this embodiment is also applicable to layout data.

<Input Information>

A semiconductor integrated circuit design support device receives mask data produced through a mask design process, and design rules. In the design rules, an air gap creation condition (see FIG. 6A), an air gap creation prohibition constraint (see FIG. 16), and an air gap non-creation instruction (see FIG. 17) are described.

The air gap creation prohibition constraint is information which specifies an area or areas (an air gap creation prohibition area or areas) in which satisfaction of the air gap creation condition in the design process is prohibited. That is, in the area or areas specified by the air gap creation prohibition constraint, each place in which the air gap creation condition is satisfied is a place (an error place) in which the air gap constraint is violated.

The air gap non-creation instruction is information which specifies an area or areas (an air gap non-creation area or areas) in which no air gap is created in the fabrication process even if the air gap creation condition is satisfied in the design process. That is, in the area or areas specified by the air gap non-creation instruction, even places in which the air gap creation condition is satisfied are not detected as air gap creation places.

<Operation>

Next, with reference to FIG. 20, the semiconductor integrated circuit design support method according to this embodiment will be described.

[Step ST401]

First, the mask data and the design rules, in which the air gap creation condition, the air gap creation prohibition constraint, and the air gap non-creation instruction are described, are read.

[Step ST402]

Next, places in which the air gap creation condition described in the design rules is satisfied are detected from the mask data, and the detected places are indicated as air gap creation places. The air gap creation places are each indicated in the shape of an ellipse, for example. In this step, places located in an area or areas specified by the air gap non-creation instruction are not detected as air gap creation places, even if the air gap creation condition is satisfied in those places. If the air gap creation places have already been stored in the mask data, this step may be omitted.

[Step ST403]

Then, of the air gap creation places detected in Step ST402, an air gap creation place or places located in an air gap creation prohibition area or areas (an area or areas specified by the air gap creation prohibition constraint) are detected. If an air gap creation place or places located in the air gap creation prohibition area or areas are detected, the process proceeds to Step ST404, and if not, the mask checking processing is terminated.

[Step ST404]

Next, the air gap creation place or places located in the air gap creation prohibition area or areas are each indicated as an error place. For example, the background color for the error place or places may be changed to a color different from the color for the other areas, or each error place may be made to blink, so that the error place or places can be visually identified.

[Step ST405]

Subsequently, the mask data is modified so as to eliminate each error place. For instance, the wire interval and the wire length associated with each error place are changed so that the air gap creation condition is not satisfied in that error place. Alternatively, a new area or areas (an area or areas including the error place or places) are additionally described in the air gap non-creation instruction so that the error place or places are included in the air gap non-creation area or areas. In this step, the designer refers to each error place displayed on the display of the semiconductor integrated circuit design support device and inputs information indicating modification of the mask data, to the semiconductor integrated circuit design support device. In accordance with the information input by the designer, the CPU in the semiconductor integrated circuit design support device modifies the mask data. When the mask data modification is complete, the process proceeds to Step ST402.

Specific Example

Next, with reference to FIGS. 21A, 21B, 22A and 22B, the semiconductor integrated circuit design support method shown in FIG. 20 will be described more specifically.

Figure 21A:
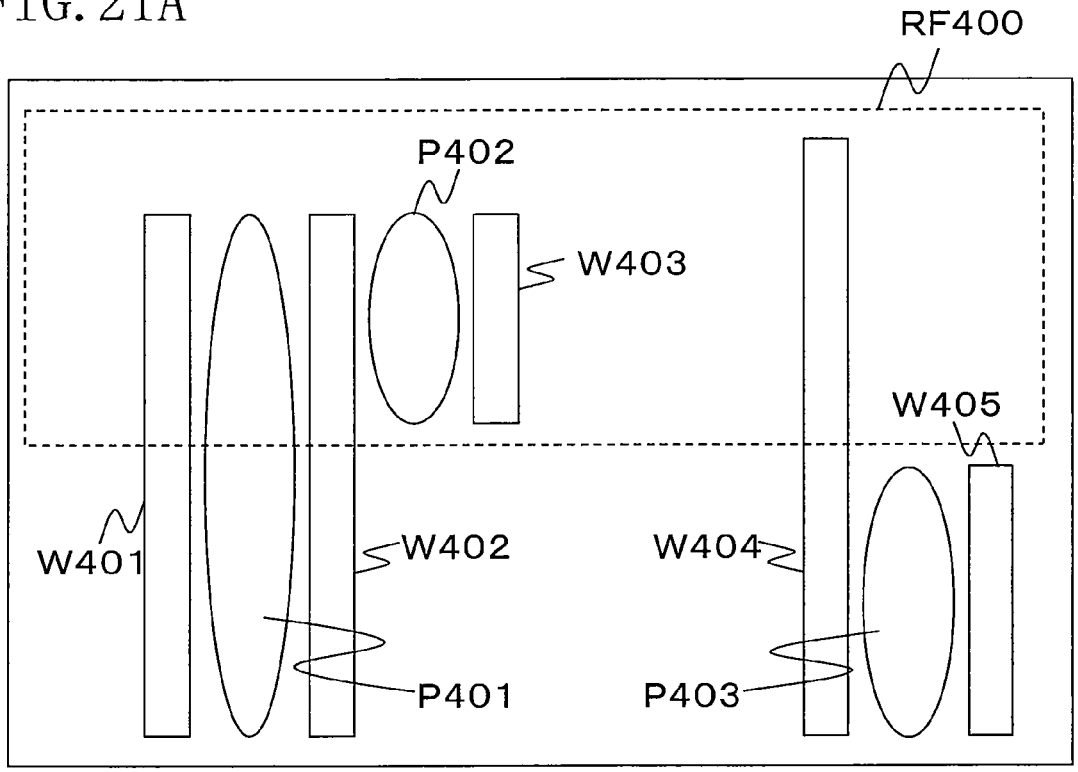
FIGS. 21A and 21B are explanatory views of indication of error places in the semiconductor integrated circuit design support method shown in FIG. 20.

First, it is assumed that air gap creation places P401, P402 and P403 are detected in Step ST402, as shown in FIG. 21A. Next, in Step ST403, of the air gap creation places P401, P402 and P403, the air gap creation place P402 located in an air gap creation prohibition area RF400 specified by the air gap creation prohibition constraint is detected. The air gap creation place P401, which is partially located in the air gap creation prohibition area RF400, is also detected.

Figure 21B:
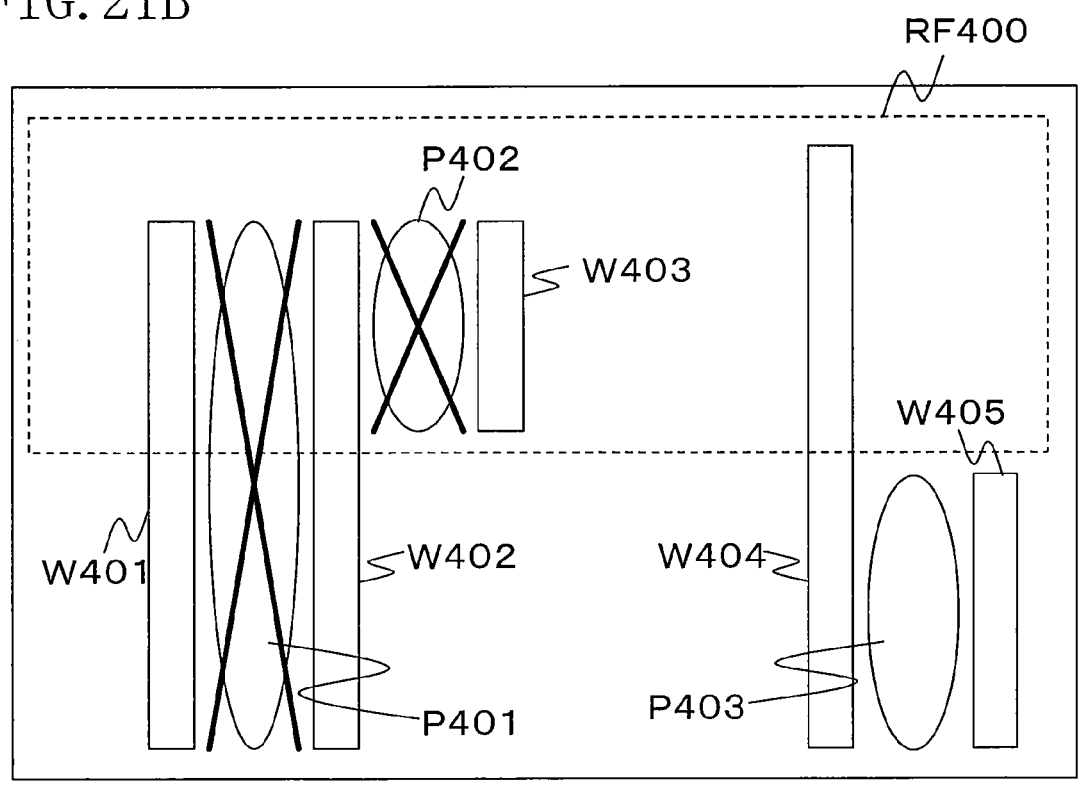

Then, in Step ST404, the air gap creation places P401 and P402 located in the air gap creation prohibition area RF400 are indicated as error places, as shown in FIG. 21B.

Figure 22A:
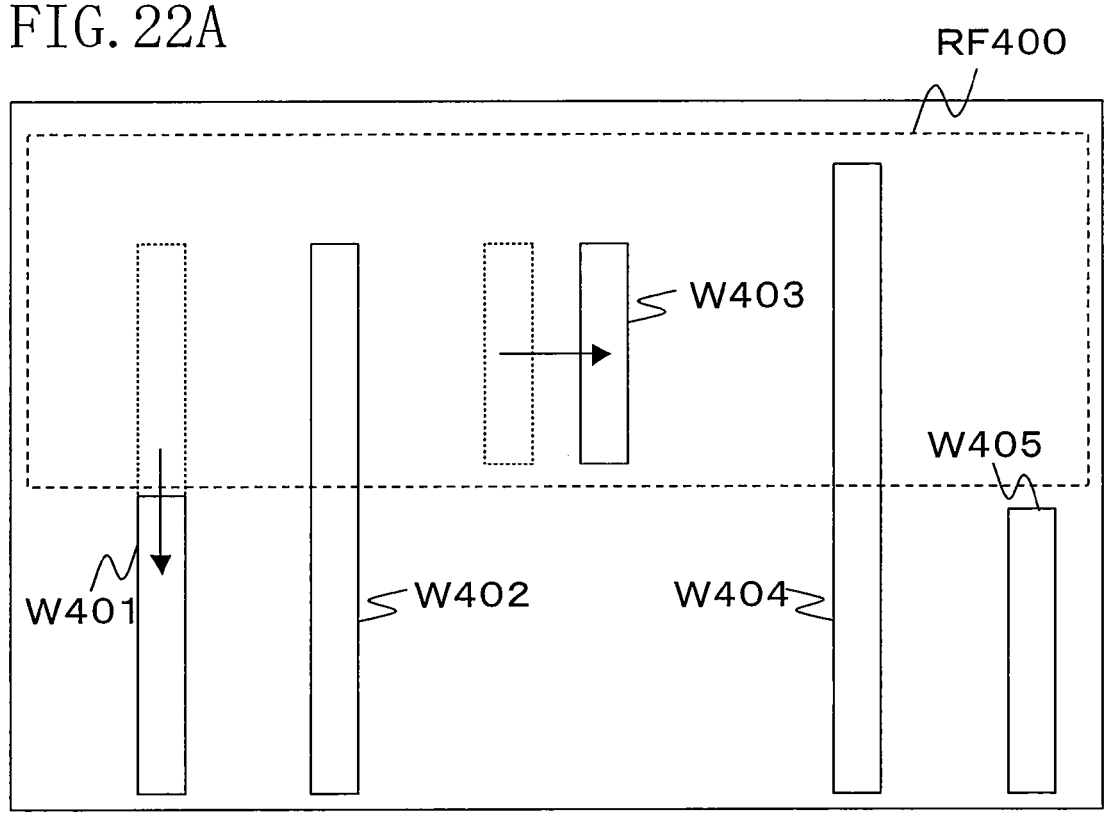
FIGS. 22A and 22B are explanatory views of modification of mask data in the semiconductor integrated circuit design support method shown in FIG. 20.
Figure 22B:
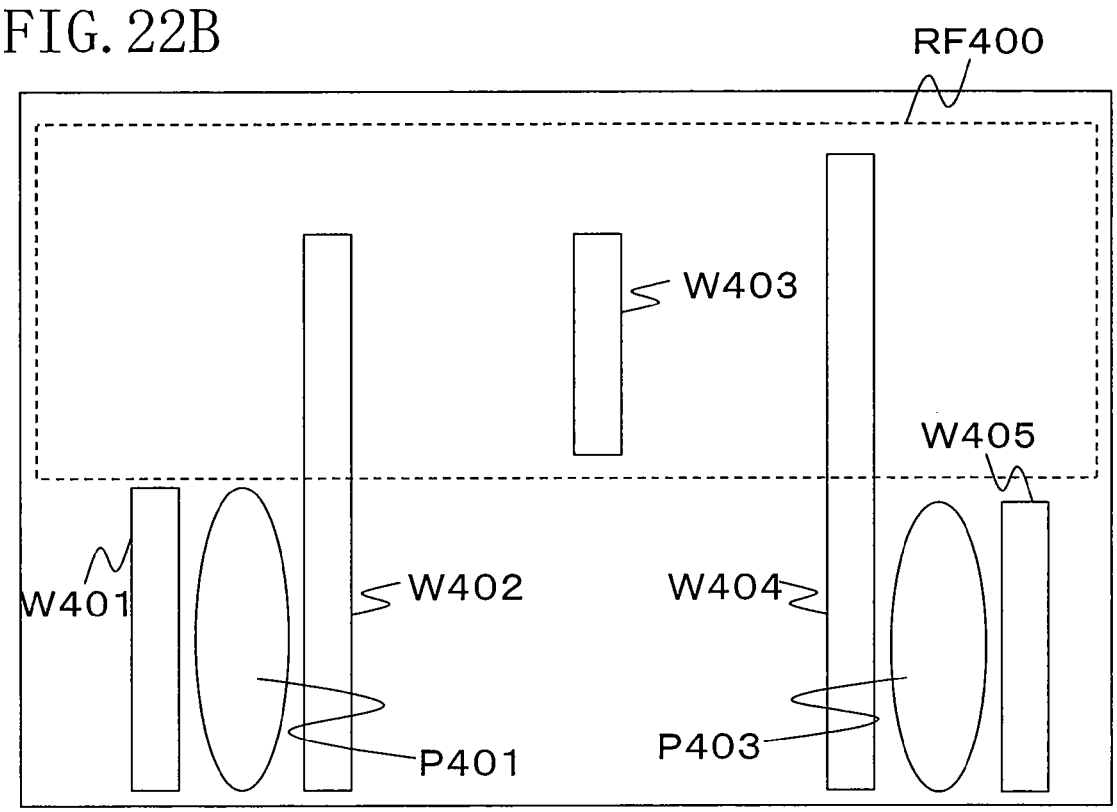

Subsequently, in Step ST405, the length of a wire W401 and the location of a wire W403 are changed as shown in FIG. 22A so as to eliminate the error places. As a result, as shown in FIG. 22B, the facing length of the wires W401 and W402 is shortened to reduce the size of the air gap creation place P401, and the facing interval between the wires W402 and W403 is increased such that the air gap creation condition is no more satisfied, causing the air gap creation place P402 to disappear. The air gap creation places (i.e., the error places) located in the air gap creation prohibition area RF400 are thus eliminated.

<Effects>

As described above, the adequacy of air gap creation places is checked in the design process of the semiconductor integrated circuit, thereby identifying inadequate air gap creation places. It is thus possible to support the design of the semiconductor integrated circuit having the air gaps properly formed therein.

Also, it is possible to check the adequacy of the air gap creation places in the entire chip area in the mask data.

Furthermore, since the air gaps formed in the inadequate places are indicated as error places, the air gap creation places that should be eliminated are visually recognizable, thereby enabling the mask data to be easily modified.

Moreover, in addition to the air gap creation prohibition constraint, a cell air gap creation prohibition constraint may be described in the design rules. Also, besides the air gap non-creation instruction, a cell air gap non-creation instruction may be described in the design rules.

[Cell Air Gap Creation Prohibition Constraint]

The cell air gap creation prohibition constraint is information which specifies, for each logic cell, whether or not air gap creation is allowed in that logic cell. In the cell air gap creation prohibition constraint, an air gap creation prohibition area (an area in which the air gap creation condition should not be satisfied) in each logic cell is described as a physical shape, as shown in FIG. 23A, for example. Alternatively, whether or not air gap creation is allowed may be defined for each logic cell, as shown in FIG. 23B.

[Cell Air Gap Non-Creation Instruction]

The cell air gap non-creation instruction is information which specifies, for each logic cell, whether or not air gap creation in the fabrication process is necessary in that logic cell. In the cell air gap non-creation instruction, an air gap non-creation area (an area in which no air gap is created in the fabrication process) in each logic cell is described as a physical shape, as shown in FIG. 24A, for example. Alternatively, whether or not air gap creation in the fabrication process is necessary may be defined for each logic cell, as shown in FIG. 24B.

In this embodiment, if the cell air gap creation prohibition constraint is described in the design rules, the following procedure may be performed: a logic cell or cells in which air gap creation is prohibited by the cell air gap creation prohibition constraint are detected from the mask data in Steps ST403 and ST404, and air gap creation places located in the detected logic cell or cells are indicated as error places.

Also, in this embodiment, if the cell air gap non-creation instruction is described in the design rules, the following procedure may be performed: a logic cell or cells that are specified by the cell air gap non-creation instruction as a logic cell or cells in which no air gap should be created in the fabrication process are detected from the mask data in Step ST402, and even if the detected logic cell or cells have places where the air gap creation condition is satisfied, those places are not detected as air gap creation places.

It should be noted that the air gap creation places do not have to be indicated in Step ST402 but may be indicated in Step ST404 so that the error places are indicated together with the air gap creation places.

Moreover, it is not necessary to indicate all of the air gap creation places, and any of the air gap creation places may be indicated selectively. Likewise, all of the error places do not have to be indicated, and any of the error places may be indicated selectively.

Also, the entire chip area on the mask data need not be displayed, but any part in the chip area may be displayed selectively. Furthermore, any part in the chip area may be displayed in an enlarged scale.

Fifth Embodiment

Figure 25:
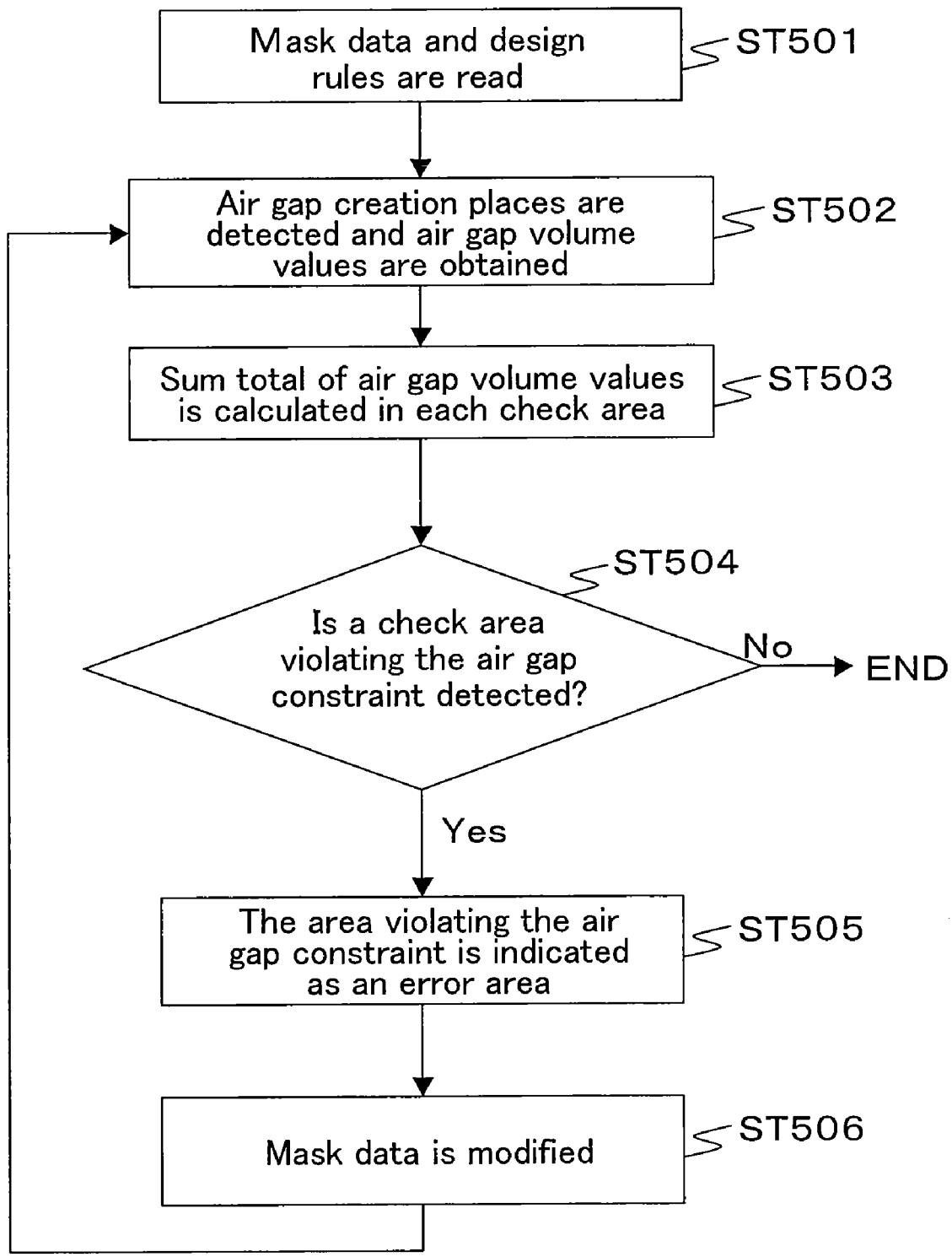
FIG. 25 is a flowchart for a method for supporting design of a semiconductor integrated circuit according to a fifth embodiment of the present invention.

FIG. 25 is a flowchart for a method for supporting design of a semiconductor integrated circuit according to a fifth embodiment of the present invention. In this semiconductor integrated circuit design support method, the adequacy of air gap volume values in mask data (or in layout data), in which logic cells have been placed and wires have been connected to each other, is checked. In this semiconductor integrated circuit design support method, a chip area represented as the mask data is divided into a plurality of check areas, and the adequacy of air gap volume values in each of the check areas is checked. It is also possible to check the adequacy of volume values in a case where the chip area is not divided.

<Input Information>

A semiconductor integrated circuit design support device receives mask data and design rules. In the design rules, an air gap creation condition (see FIGS. 6A and 6B), an air gap calculation method (see FIGS. 7A and 7B), an air gap creation instruction (see FIG. 18), and air gap representation information (see FIG. 19) are described.

The air gap creation instruction is information which specifies a place or places in which an air gap is created in the fabrication process irrespective of whether or not the air gap creation condition is satisfied in the design process. That is, each place specified by the air gap creation instruction is detected as an air gap creation place regardless of whether or not the air gap creation condition is satisfied in that place.

The air gap representation information indicates a place or places (i.e., an air gap creation place or places) in which the air gap creation condition is satisfied.

<Operation>

Next, with reference to FIG. 25, the semiconductor integrated circuit design support method according to this embodiment will be described.

[Step ST501]

First, the mask data and the design rules, in which the air gap creation condition, the air gap calculation method, the air gap creation instruction, and the air gap representation information are described, are read.

[Step ST502]

Next, places in which the air gap creation condition described in the design rules is satisfied are detected from the mask data, and the detected places are indicated as air gap creation places. And places specified by the air gap creation instruction and by the air gap representation information are also indicated as air gap creation places. In accordance with the air gap calculation method described in the design rules, an air gap volume value in each of the air gap creation places is then calculated, and the calculated air gap volumes are indicated in the corresponding air gap creation places.

[Step ST503]

Subsequently, the sum total of the air gap volume values in each check area is calculated.

[Step ST504]

Next, for each of the check areas, the allowable range of the sum total of air gap volume values that corresponds to the area size of that check area is detected from the air gap constraint described in the design rules. Then, for each check area, it is determined whether or not the sum total of the air gap volume values in that check area calculated in Step ST503 is within the allowable range. That is, in each check area, whether or not the air gap constraint is violated is checked. When a check area or areas in which the air gap constraint is violated are detected, the process proceeds to Step ST505, and if not, the mask checking processing is terminated.

[Step ST505]

Next, the detected area or areas in which the air gap constraint is violated are each indicated as an error area. For example, the background color for the error area or areas is changed to a color different from the color for the other areas so that the error area or areas can be visually identified. Furthermore, in each error area, how much higher or lower the sum total of the air gap volume values is than the upper or lower limit of the allowable range may be indicated as a violation value in order to visually recognize how much the sum total of the air gap volume values should be lowered or raised in that error area.

[Step ST506]

Then, the mask data is modified so as to eliminate the air gap constraint violation in each error area. For instance, wire intervals and wire lengths in each error area are changed. When the mask data modification is complete, the process proceeds to Step ST502.

Specific Example

Next, with reference to FIGS. 26A and 26B, the semiconductor integrated circuit design support method shown in FIG. 25 will be described more specifically.

Figure 26A:
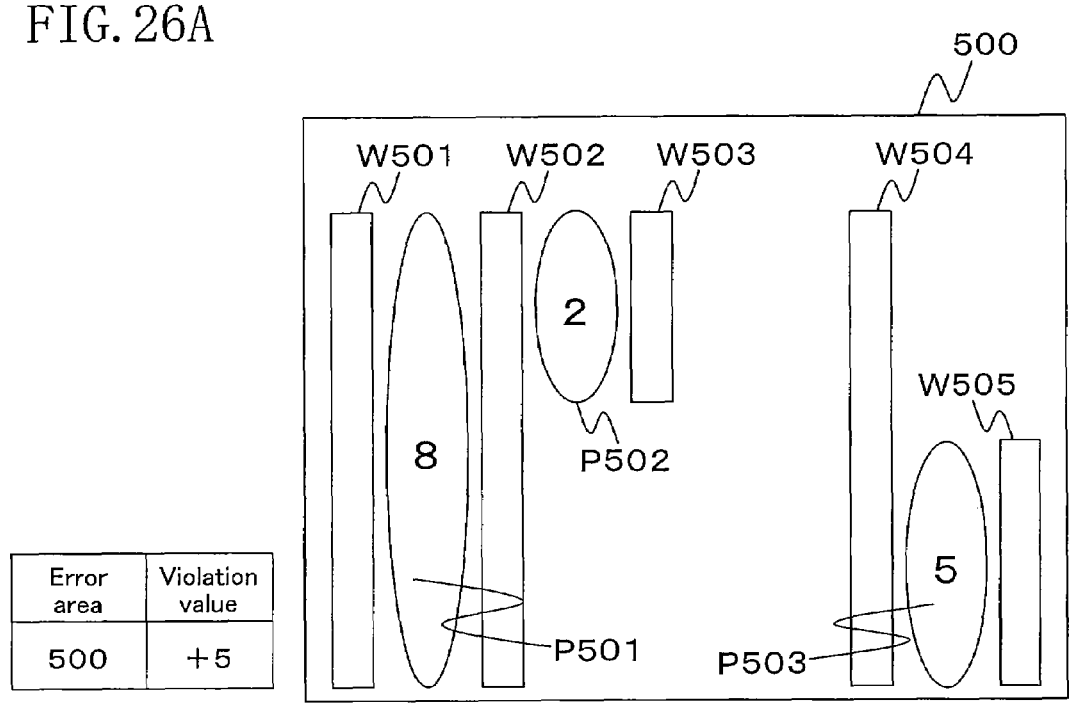
FIGS. 26A and 26B are explanatory views of indication of error areas and modification of mask data in the semiconductor integrated circuit design support method shown in FIG. 25.

First, in Step ST502, air gap creation places P501, P502 and P503 are detected as shown in FIG. 26A, and an air gap volume value is calculated for each of the air gap creation places. In this case, it is assumed that the air gap volume values in the air gap creation places P501, P502 and P503 are 8, 2, and 5, respectively. Then, in Step ST503, the sum total of the air gap volume values (which is 15 in this case) is calculated.

Next, in Step ST504, it is assumed that the allowable range of the sum total of air gap volume values for a check area 500 specified by the air gap constraint is from 3 to 10. In this case, since the sum total of the air gap volume values in the check area 500 is 15 and thus exceeds the upper limit (which is 10) of the allowable range, the check area 500 is indicated as an error area and a violation value of +5 in the check area 500 is also indicated in Step ST505.

Figure 26B:
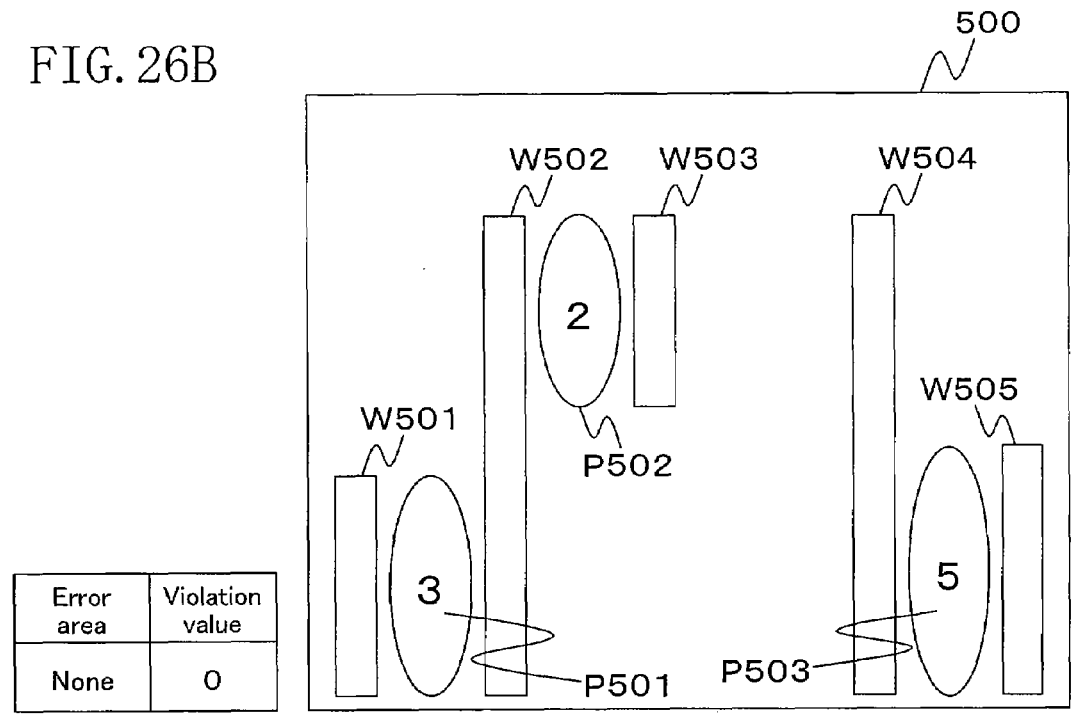

Subsequently, in Step ST505, the length of a wire W501 is changed for elimination of the air gap constraint violation in the error place as shown in FIG. 26B. As a result, the facing length of the wires W501 and W502 is shortened to cause the air gap volume value in the air gap creation place P501 to decrease to 3, whereby the sum total of the air gap volume values in the check area 500 is 10. The air gap constraint violation in the check area 500 is thus eliminated.

<Effects>

As described above, the adequacy of the air gap volume values is checked in the design process of the semiconductor integrated circuit, thereby identifying the place having an inadequate air gap volume value. It is thus possible to support the design of the semiconductor integrated circuit having the air gaps properly formed therein.

Also, it is possible to check the adequacy of the air gap volume values in the entire chip area on the mask data.

Furthermore, since each check area having an inadequate air gap volume value is indicated as an error area, each area requiring modification is visually recognizable, thereby enabling the mask data to be easily modified.

(Definitions of Areas and Places)

As shown in FIG. 15A, when a corner of the rectangular chip area on the layout data or on the mask data (e.g., the lower left corner of the chip area when the layout data is displayed on the display) is used as the origin point, each area specified by the air gap non-creation instruction and by the air gap creation prohibition constraint can be defined by the lower left coordinates and the upper right coordinates of that area or by the lower left coordinates and the vertical and horizontal dimensions of that area.

Also, each place specified by the air gap creation instruction and by the air gap representation information can be defined by the lower left coordinates and the upper right coordinates of that place or by the lower left coordinates and the vertical and horizontal dimensions of that place.

Furthermore, each air gap creation place specified by the cell information may be defined by the central coordinates of that air gap creation place and by the wiring layer in which that air gap is created. The shape of each air gap may be defined by the vertical and horizontal dimensions of that air gap, may be defined as an ellipse with the central coordinates being approximately the center thereof, or may be defined three-dimensionally by the vertical and horizontal dimensions and the height of that air gap.

Moreover, the areas, places, and the like thus defined may be stored in the database so as to be shared in different design processes. Then, the time required for calculation of the air gap creation places, etc., is reduced, thereby enabling the processing time to be shortened.

(Descriptions of Information)

Hereinafter, a description will be made of the air gap creation prohibition constraint, the air gap non-creation instruction, the air gap creation instruction, and the air gap representation information used in the foregoing embodiments.

[Air Gap Creation Prohibition Constraint]

The air gap creation prohibition constraint is information which specifies an area or areas (an air gap creation prohibition area or areas) in which satisfaction of the air gap creation condition in the design process is prohibited. For instance, as shown in FIG. 16, the air gap creation prohibition constraint may define an air gap creation prohibition area or areas for each wiring layer, or may define an air gap creation prohibition area or areas for all wiring layers at a time.

[Air Gap Non-Creation Instruction]

The air gap non-creation instruction is information which specifies an area or areas in which no air gap is created in the fabrication process even if the air gap creation condition is satisfied in the design process. As shown in FIG. 17, for example, the air gap non-creation instruction may define, for each wiring layer, an area or areas that are controlled so that no air gap is created therein in the fabrication process, or may define, for all wiring layers at a time, an area or areas that are controlled so that no air gap is created therein in the fabrication process. Alternatively, in the manner opposite to FIG. 17, an area or areas that are controlled so that an air gap is created therein in the fabrication process may be defined.

[Air Gap Creation Instruction]

The air gap creation instruction is information which specifies a place or places in which an air gap is created in the fabrication process even if the air gap creation condition is not satisfied in the design process. As shown in FIG. 18, for example, the air gap creation instruction may define, for each wiring layer, a place or places where an air gap is created, or may define, for all wiring layers at a time, a place or places where an air gap is created. That is, each place specified by the air gap creation instruction is considered to be an air gap creation place regardless of whether or not the air gap creation condition is satisfied in that place.

[Air Gap Representation Information]

The air gap representation information is information indicating a place or places (i.e., an air gap creation place or places) in which the air gap creation condition is satisfied. For example, the air gap representation information is used to display the air gap creation place or places on the display in the layout design process (or in the mask checking process). The air gap representation information is a definition indicating an air gap creation place or places for each wiring layer, as shown in FIG. 19, for example.

It is desirable that each air gap creation prohibition area and each air gap non-creation area be specified based on the physical characteristics of the semiconductor integrated circuit, such as resistance to thermal or mechanical stress in the semiconductor integrated circuit. For example, an area having a relatively low resistance to thermal or mechanical stress is specified as an air gap creation prohibition area. Likewise, each place specified by the air gap creation instruction is preferably determined based on the physical characteristics of the semiconductor integrated circuit, such as resistance to thermal or mechanical stress, wiring delay, and crosstalk noise in the semiconductor integrated circuit.

What is claimed is:

1. A method for designing a semiconductor integrated circuit having air gaps formed therein, the method comprising:
the input step of receiving circuit data on the semiconductor integrated circuit, design constraints as to design of the semiconductor integrated circuit, air gap information on air gap creation in the circuit data, and an air gap volume constraint specifying an allowable range for an air gap volume value;
the calculation step of calculating via a processor, the sum total of the values of the volumes of air gaps created in the circuit data according to the air gap information;
the detection step of detecting that the sum total of the air gap volume values calculated in the calculation step falls outside the allowable range specified by the air gap volume constraint; and
the optimization step of, upon detection in the detection step that the sum total of the air gap volume values falls outside the allowable range, optimizing the circuit data so that the design constraints are satisfied and the sum total of the air gap volume values falls within the allowable range.

2. The method of claim 1, wherein the circuit data is a net list in which a plurality of logic cells are described;
the air gap information contains cell information in which air gap volume values corresponding to logic cells used to produce the netlist are described;
in the calculation step, an air gap volume value in each of the logic cells described in the net list is obtained according to the cell information, and the sum total of the obtained air gap volume values is calculated; and
in the optimization step, one or more or all of the logic cells described in the netlist are replaced with one or more logic cells having a different air gap volume value from the replaced logic cell or logic cells, so that the design constraints are satisfied and the sum total of the air gap volume values falls within the allowable range.

3. The method of claim 1, wherein the circuit data is layout data in which a plurality of logic cells are placed;
the air gap information contains cell information in which air gap volume values corresponding to logic cells used to produce the layout data are described;
in the calculation step, an air gap volume value in each of the logic cells described in the layout data is obtained according to the cell information, and for each of a plurality of check areas obtained by dividing an area in the layout data, the sum total of the air gap volume values in that check area is calculated;
in the detection step, a check area, in which the sum total of the air gap volume values calculated in the calculation step falls outside the allowable range specified by the air gap volume constraint, is detected from the check areas; and
in the optimization step, the locations of the logic cells in the layout data are optimized so that the design constraints are satisfied and the sum total of the air gap volume values in the check area detected in the detection step falls within the allowable range.

4. The method of claim 1, wherein the circuit data is layout data in which a plurality of logic cells are placed and connected to each other by wires;
the air gap information contains cell information, creation condition information, and calculation method information, the cell information being information, in which air gap volume values corresponding to logic cells used to produce the layout data are described, the creation condition information indicating a condition (an air gap creation condition) for air gap creation in the layout data, and the calculation method information indicating a method (an air gap calculation method) used for air gap volume value calculation in the layout data;
in the calculation step, a place in the layout data in which the air gap creation condition is satisfied is detected, an air gap volume value in the detected place is obtained according to the air gap calculation method, an air gap volume value in each of the logic cells described in the layout data is obtained according to the cell information, and for each of a plurality of check areas obtained by dividing an area in the layout data, the sum total of the air gap volume values in that check area is calculated;
in the detection step, a check area, in which the sum total of the air gap volume values calculated in the calculation step falls outside the allowable range specified by the air gap volume constraint, is detected from the check areas; and in the optimization step, at least either the locations of the logic cells or the wiring connections in the layout data are optimized so that the design constraints are satisfied and the sum total of the air gap volume values in the check area detected in the detection step falls within the allowable range.

5. A method for supporting design of a semiconductor integrated circuit having air gaps formed therein, the method comprising:
the input step of receiving circuit data, in which logic cells are placed and connected with each other by wires, air gap creation place information indicating air gap creation places in the circuit data, and an air gap creation prohibition constraint specifying an area in the circuit data in which air gap creation is prohibited;
the detection step of detecting an air gap creation place located in the area specified by the air gap creation prohibition constraint, from the air gap creation places indicated by the air gap creation place information; and
the error-place output step of outputting and displaying information in which the air gap creation place detected in the detection step is indicated as an error place.

6. The method of claim 5, further comprising the air gap display step of displaying the air gap creation places indicated by the air gap creation place information,
wherein in the error-place output step, the air gap creation place detected in the detection step is displayed as an error place.

7. The method of claim 5, wherein the input step includes:
the prior-stage input step of receiving the circuit data, creation condition information indicating a condition (an air gap creation condition) for air gap creation in the circuit data, and the air gap creation prohibition constraint; and
the air gap detection step of detecting places in the circuit data, in which the air gap creation condition is satisfied, and setting information indicating the detected places as the air gap creation place information.

8. The method of claim 6, wherein the input step includes:
the prior-stage input step of receiving the circuit data, creation condition information indicating a condition (an air gap creation condition) for air gap creation in the circuit data, and the air gap creation prohibition constraint; and
the air gap detection step of detecting places in the circuit data, in which the air gap creation condition is satisfied, and setting information indicating the detected places as the air gap creation place information.

9. A method for supporting design of a semiconductor integrated circuit having air gaps formed therein, the method comprising:
the input step of receiving circuit data, air gap information, and an air gap volume constraint, the circuit data being data in which logic cells are placed and connected with each other by wires, the air gap information indicating air gap creation places and air gap volume values in the circuit data, the air gap volume constraint specifying an allowable range for an air gap volume value;
the calculation step of calculating the sum total of air gap volume values in each of a plurality of check areas obtained by dividing an area in the circuit data, in accordance with the air gap information;
the detection step of detecting, from the check areas, a check area in which the sum total of the air gap volume values calculated in the calculation step falls outside the allowable range specified by the air gap volume constraint; and the error-area output step of outputting and displaying error-area information in which the check area detected in the detection step is indicated as an error area.

10. The method of claim 9, further comprising the air gap display step of displaying the air gap creation places indicated by the air gap information,
wherein in the error-area output step, the check area detected in the detection step is displayed as an error area.

11. The method of claim 9, wherein the input step includes:
the prior-stage input step of receiving the circuit data, creation condition information indicating a condition (an air gap creation condition) for air gap creation in the circuit data, calculation method information indicating a method (an air gap calculation method) used for air gap volume value calculation in the circuit data, and the air gap creation prohibition constraint; and
the air gap detection step of detecting places in the circuit data, in which the air gap creation condition is satisfied, obtaining air gap volume values in the detected places in accordance with the air gap calculation method, and setting information indicating the detected places and the obtained air gap volume values as the air gap information.

12. The method of claim 10, wherein the input step includes:
the prior-stage input step of receiving the circuit data, creation condition information indicating a condition (an air gap creation condition) for air gap creation in the circuit data, calculation method information indicating a method (an air gap calculation method) used for air gap volume value calculation in the circuit data, and the air gap creation prohibition constraint; and
the air gap detection step of detecting places in the circuit data, in which the air gap creation condition is satisfied, obtaining air gap volume values in the detected places in accordance with the air gap calculation method, and setting information indicating the detected places and the obtained air gap volume values as the air gap information.

* * * * *